US011751408B2

(12) United States Patent
Parekh

(10) Patent No.: US 11,751,408 B2
(45) Date of Patent: Sep. 5, 2023

(54) METHODS OF FORMING MICROELECTRONIC DEVICES, AND RELATED MICROELECTRONIC DEVICES, MEMORY DEVICES, AND ELECTRONIC SYSTEMS

(71) Applicant: Micron Technology, Inc., Boise, ID (US)

(72) Inventor: Kunal R. Parekh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 25 days.

(21) Appl. No.: 17/165,746

(22) Filed: Feb. 2, 2021

(65) Prior Publication Data

US 2022/0246681 A1 Aug. 4, 2022

(51) Int. Cl.
*H01L 25/16* (2023.01)
*H01L 25/18* (2023.01)
(Continued)

(52) U.S. Cl.
CPC ............ *H10B 63/84* (2023.02); *G11C 5/063* (2013.01); *H01L 25/16* (2013.01); *H01L 25/18* (2013.01);
(Continued)

(58) Field of Classification Search
CPC ..... H01L 27/2481; H01L 25/16; H01L 25/18; H01L 27/11524; H01L 27/11529;
(Continued)

(56) References Cited

U.S. PATENT DOCUMENTS 4,925,809 A 5/1990 Yoshiharu et al.
6,165,247 A 12/2000 Kodas et al.
(Continued)

FOREIGN PATENT DOCUMENTS

CN 107768376 A 3/2018
CN 107887395 A 4/2018
(Continued)

OTHER PUBLICATIONS

Choe, YMTC is China's First Mass Producer of 3D NAND Flash Memory Chips, Mar. 12, 2020, (available at https://www.techinsights.com/blog/ymtc-chinas-first-mass-producer-3d-nand-flash-memory-chips), 2 pages.
(Continued)

*Primary Examiner* — David Vu
(74) *Attorney, Agent, or Firm* — TraskBritt

(57) ABSTRACT

A method of forming a microelectronic device comprises forming a microelectronic device structure comprising a first control logic region comprising first control logic devices, and a first memory array region vertically overlying the first control logic region and comprising an array of vertically extending strings of memory cells. An additional microelectronic device structure comprising a semiconductive material is attached to an upper surface of the microelectronic device structure. A portion of the semiconductive material is removed. A second control logic region is formed over the first memory array region. The second control logic region comprises second control logic devices and a remaining portion of the semiconductive material. A second memory array region is formed over the second control logic region. The second memory array region comprises an array of resistance variable memory cells. Microelectronic devices, memory devices, and electronic systems are also described.

25 Claims, 7 Drawing Sheets

(51) Int. Cl.
  *H10B 63/00*    (2023.01)
  *G11C 5/06*     (2006.01)
  *H10B 41/27*    (2023.01)
  *H10B 41/35*    (2023.01)
  *H10B 41/41*    (2023.01)
  *H10B 43/27*    (2023.01)
  *H10B 43/35*    (2023.01)
  *H10B 43/40*    (2023.01)
  *H10N 70/00*    (2023.01)

(52) U.S. Cl.
  CPC .............. *H10B 41/27* (2023.02); *H10B 41/35* (2023.02); *H10B 41/41* (2023.02); *H10B 43/27* (2023.02); *H10B 43/35* (2023.02); *H10B 43/40* (2023.02); *H10B 63/34* (2023.02); *H10N 70/011* (2023.02); *H10N 70/882* (2023.02)

(58) Field of Classification Search
  CPC ........... H01L 27/11556; H01L 27/1157; H01L 27/11573; H01L 27/11582; H01L 27/2454; H01L 45/141; H01L 45/16; H01L 45/06; H01L 45/1233; H01L 45/144; H01L 27/2409; H01L 27/2418; H01L 27/2427; H01L 27/2463; H01L 25/0657; H01L 25/50; H01L 27/11548; H01L 27/11575; H01L 27/2436; H01L 27/249; G11C 5/063; H10B 63/84; H10B 41/27; H10B 41/35; H10B 41/41; H10B 43/27; H10B 43/35; H10B 43/40; H10B 63/34; H10B 63/20; H10B 63/24; H10B 63/22; H10B 63/80; H10B 41/50; H10B 43/50; H10B 63/30; H10B 63/845; H10N 70/011; H10N 70/882; H10N 70/231; H10N 70/826; H10N 70/8828
  See application file for complete search history.

(56) References Cited

U.S. PATENT DOCUMENTS

| | | |
|---|---|---|
| 7,372,091 B2 | 5/2008 | Leslie |
| 7,897,485 B2 | 3/2011 | Parekh |
| 8,042,082 B2 | 10/2011 | Solomon |
| 8,958,228 B2 | 2/2015 | Samachisa et al. |
| 9,196,753 B2 | 11/2015 | Ramaswamy et al. |
| 9,397,145 B1 | 7/2016 | Sills et al. |
| 9,449,652 B2 | 9/2016 | Juengling |
| 9,515,083 B2 | 12/2016 | Lee et al. |
| 9,530,790 B1 | 12/2016 | Lu et al. |
| 9,553,263 B1 | 1/2017 | Petz et al. |
| 9,590,012 B2 | 3/2017 | Lee et al. |
| 9,653,617 B2 | 5/2017 | Zhou et al. |
| 9,922,716 B2 | 3/2018 | Hsiung et al. |
| 10,141,330 B1 | 11/2018 | Lindsay et al. |
| 10,283,703 B2 | 5/2019 | Pellizzer et al. |
| 10,381,362 B1 | 8/2019 | Cui et al. |
| 10,665,580 B1 | 5/2020 | Hosoda et al. |
| 10,847,220 B2 | 11/2020 | Castro |
| 11,282,815 B2 | 3/2022 | Parekh et al. |
| 11,335,602 B2 | 5/2022 | Parekh |
| 11,380,669 B2 | 7/2022 | Parekh |
| 11,545,456 B2 | 1/2023 | Goda et al. |
| 11,557,569 B2 | 1/2023 | Parekh |
| 11,563,018 B2 | 1/2023 | Parekh |
| 2003/0113669 A1 | 6/2003 | Cheng et al. |
| 2003/0151083 A1 | 8/2003 | Matsui et al. |
| 2005/0265076 A1 | 12/2005 | Forbes |
| 2006/0076690 A1 | 4/2006 | Khandros et al. |
| 2007/0288702 A1 | 12/2007 | Roohparvar |
| 2008/0019165 A1 | 1/2008 | Lin et al. |
| 2009/0168482 A1 | 7/2009 | Park et al. |
| 2011/0159645 A1 | 6/2011 | Pekny |
| 2011/0309431 A1 | 12/2011 | Kidoh et al. |
| 2012/0047321 A1 | 2/2012 | Yoon et al. |
| 2012/0161094 A1 | 6/2012 | Huo et al. |
| 2012/0181602 A1 | 7/2012 | Fukuzumi et al. |
| 2012/0224426 A1 | 9/2012 | Nam et al. |
| 2013/0126622 A1 | 5/2013 | Finn |
| 2013/0130468 A1 | 5/2013 | Higashitani et al. |
| 2014/0001583 A1 | 1/2014 | Teh et al. |
| 2014/0061750 A1 | 3/2014 | Kwon et al. |
| 2014/0063938 A1 | 3/2014 | Oh et al. |
| 2014/0124726 A1 | 5/2014 | Oh |
| 2014/0175637 A1 | 6/2014 | Stuber et al. |
| 2014/0204675 A1 | 7/2014 | Cho et al. |
| 2015/0091180 A1 | 4/2015 | Ong et al. |
| 2015/0243708 A1 | 8/2015 | Ravasio et al. |
| 2015/0278675 A1 | 10/2015 | Finn et al. |
| 2016/0049201 A1 | 2/2016 | Lue et al. |
| 2016/0079164 A1 | 3/2016 | Fukuzumi et al. |
| 2016/0104715 A1 | 4/2016 | Pachamuthu et al. |
| 2016/0268304 A1 | 9/2016 | Ikeda et al. |
| 2016/0343727 A1 | 11/2016 | Kim et al. |
| 2017/0025421 A1 | 1/2017 | Sakakibara et al. |
| 2017/0054036 A1 | 2/2017 | Dorhout et al. |
| 2017/0092649 A1 | 3/2017 | Takaoka |
| 2017/0148802 A1 | 5/2017 | Dorhout et al. |
| 2018/0053768 A1 | 2/2018 | Kim et al. |
| 2018/0108741 A1 | 4/2018 | Li et al. |
| 2018/0158689 A1 | 6/2018 | Mumford |
| 2019/0043836 A1 | 2/2019 | Fastow et al. |
| 2019/0088493 A1 | 3/2019 | Watanabe et al. |
| 2019/0096906 A1 | 3/2019 | Lindsay et al. |
| 2019/0206861 A1 | 7/2019 | Beigel et al. |
| 2019/0221557 A1 | 7/2019 | Kim et al. |
| 2019/0229089 A1 | 7/2019 | Zhou et al. |
| 2019/0355786 A1 | 11/2019 | Iguchi |
| 2020/0006380 A1 | 1/2020 | Van et al. |
| 2020/0013792 A1 | 1/2020 | Parekh et al. |
| 2020/0013798 A1 | 1/2020 | Parekh |
| 2020/0066745 A1 | 2/2020 | Yu et al. |
| 2020/0083245 A1 | 3/2020 | Fayrushin et al. |
| 2020/0098776 A1 | 3/2020 | Sugisaki |
| 2020/0135541 A1 | 4/2020 | Wu et al. |
| 2020/0159133 A1 | 5/2020 | Yan et al. |
| 2020/0161295 A1 | 5/2020 | Sills et al. |
| 2020/0185406 A1 | 6/2020 | Li et al. |
| 2020/0219815 A1 | 7/2020 | Elsherbini et al. |
| 2020/0227397 A1 | 7/2020 | Yada et al. |
| 2020/0258816 A1 | 8/2020 | Okina et al. |
| 2020/0258876 A1 | 8/2020 | Hosoda et al. |
| 2020/0258904 A1 | 8/2020 | Kai et al. |
| 2020/0273840 A1 | 8/2020 | Elsherbini et al. |
| 2021/0074711 A1 | 3/2021 | Suzuki et al. |
| 2021/0082939 A1 | 3/2021 | Matsuda |
| 2021/0134778 A1 | 5/2021 | Huang et al. |
| 2021/0296316 A1 | 9/2021 | Zhu |
| 2021/0343690 A1 | 11/2021 | Salmon |
| 2021/0398847 A1 | 12/2021 | Parekh |
| 2021/0398897 A1 | 12/2021 | Parekh |
| 2022/0020736 A1 | 1/2022 | Yip et al. |
| 2022/0028830 A1 | 1/2022 | Kirby |
| 2022/0059560 A1 | 2/2022 | Parekh |

FOREIGN PATENT DOCUMENTS

| | | |
|---|---|---|
| CN | 108447865 A | 8/2018 |
| CN | 111247636 A | 6/2020 |
| JP | 2002-103299 A | 4/2002 |
| KR | 10-2009-0034570 A | 4/2009 |
| KR | 10-2014-0117062 A | 10/2014 |
| KR | 10-2015-0085155 A | 7/2015 |
| KR | 10-2020-0008606 A | 1/2020 |
| KR | 10-2020-0037444 A | 4/2020 |
| TW | 201511319 A | 3/2015 |
| TW | 201826556 A | 7/2018 |
| TW | 201941407 B | 10/2019 |
| TW | 201946057 A | 12/2019 |
| TW | 202008568 B | 2/2020 |
| WO | 2008/063251 A2 | 5/2008 |

(56) References Cited

FOREIGN PATENT DOCUMENTS

OTHER PUBLICATIONS

Li et al., Skybridge-3D-CMOS: A Fine-Grained 3D CMOS Integrated Circuit Technology, IEEE Transactions on Nanotechnology, vol. 16, No. 4, Jul. 2017, 14 pages.

YMTC, About Xtacking, Xtacking Enables Dram-Like High I/O Speed, www.ymtc.com/Index.php?s=/cms/cate/69.html, (Apr. 20, 2020), 3 pages.

METHODS OF FORMING MICROELECTRONIC DEVICES, AND RELATED MICROELECTRONIC DEVICES, MEMORY DEVICES, AND ELECTRONIC SYSTEMS

TECHNICAL FIELD

The disclosure, in various embodiments, relates generally to the field of microelectronic device design and fabrication. More specifically, the disclosure relates to methods of forming microelectronic devices and memory devices, and to related microelectronic devices, memory devices, and electronic systems.

BACKGROUND

Microelectronic device designers often desire to increase the level of integration or density of features within a microelectronic device by reducing the dimensions of the individual features and by reducing the separation distance between neighboring features. In addition, microelectronic device designers often desire to design architectures that are not only compact, but offer performance advantages, as well as simplified, easier and less expensive to fabricate designs.

One example of a microelectronic device is a memory device. Memory devices are generally provided as internal integrated circuits in computers or other electronic devices. There are many types of memory devices including, but not limited to, non-volatile memory (NVM) devices, such as flash memory devices (e.g., NAND flash memory devices), and resistance variable memory devices (e.g., resistive random access memory (RRAM) devices, conductive bridge random access memory (conductive bridge RAM) devices, magnetic random access memory (MRAM) devices, phase change material (PCM) memory devices, phase change random access memory (PCRAM) devices, spin-torque-transfer random access memory (STTRAM) devices, oxygen vacancy-based memory devices, programmable conductor memory devices).

Some non-volatile memory devices, such as many resistance variable memory devices, include a memory array exhibiting a cross-point architecture including conductive lines (e.g., access lines, such as word lines) extending perpendicular (e.g., orthogonal) to additional conductive lines (e.g., data lines, such as bit lines), and memory cells located at intersections of and interposed between the conductive lines and the additional conductive lines.

Additional non-volatile memory devices, such as many flash memory devices, utilize vertical memory array (also referred to as a "three-dimensional (3D) memory array") architectures. A conventional vertical memory array includes strings of memory cells vertically extending through one or more decks (e.g., stack structures) including tiers of conductive materials and insulative materials. Each string of memory cells may include at least one select device coupled in series to a serial combination of vertically stacked memory cells. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

Control logic devices within a base control logic structure underlying a memory array of a memory device (e.g., a non-volatile memory device) have been used to control operations (e.g., access operations, read operations, write operations) on the memory cells of the memory device. An assembly of the control logic devices may be provided in electrical communication with the memory cells of the memory array by way of routing and interconnect structures. However, processing conditions (e.g., temperatures, pressures, materials) for the formation of the memory array over the base control logic structure can limit the configurations and performance of the control logic devices within the base control logic structure. In addition, the quantities, dimensions, and arrangements of the different control logic devices employed within the base control logic structure can also undesirably impede reductions to the size (e.g., horizontal footprint) of a memory device, and/or improvements in the performance (e.g., faster memory cell ON/OFF speed, lower threshold switching voltage requirements, faster data transfer rates, lower power consumption) of the memory device.

DETAILED DESCRIPTION

Figure 1A:
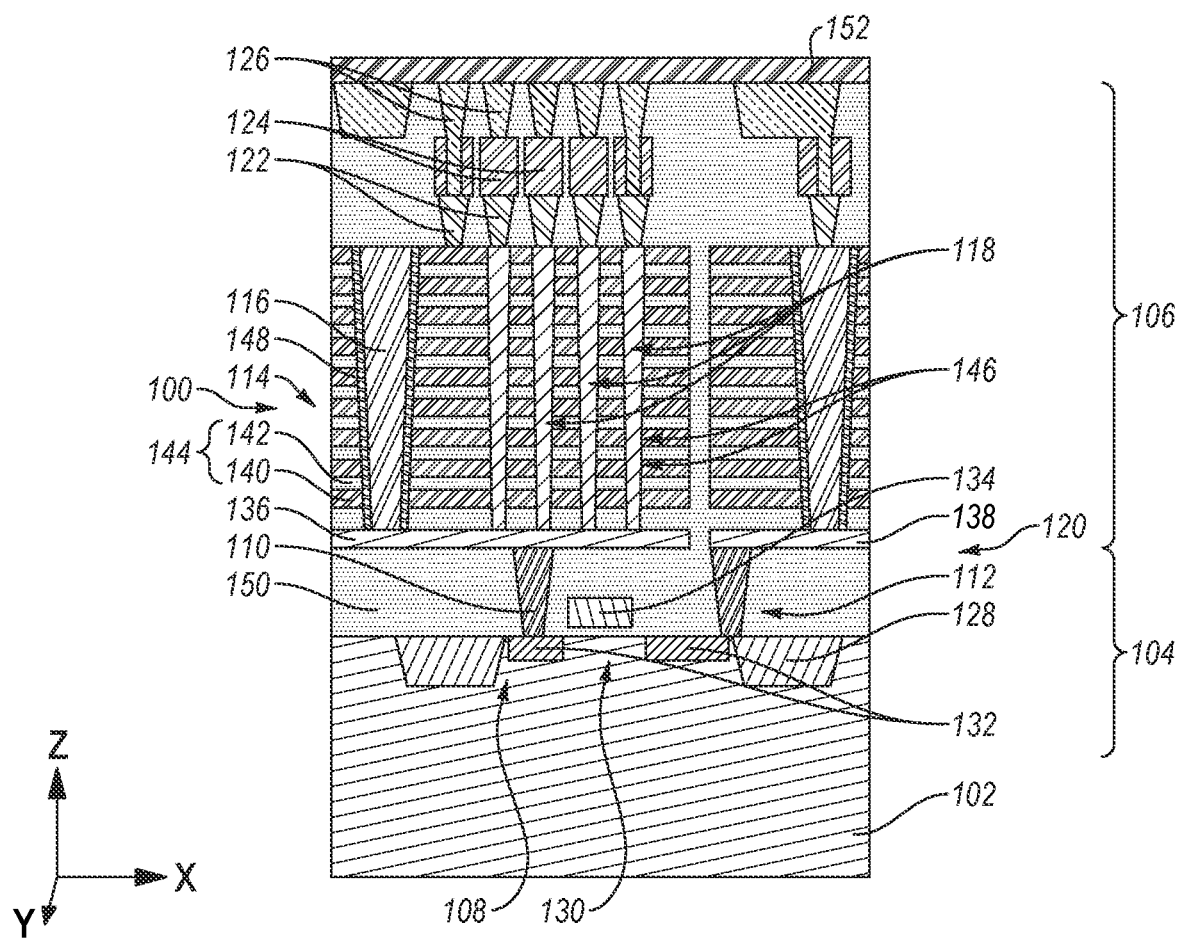
FIGS. 1A through 1F are simplified, partial cross-sectional views illustrating different processing stages of a method of forming a microelectronic device, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes microelectronic devices exhibiting memory functionality, but not necessarily limited to memory functionality. Stated another way, and by way of non-limiting example only, the term "memory device" includes not only conventional memory (e.g., conventional volatile memory; conventional non-volatile memory), but also includes an application specific integrated circuit (ASIC) (e.g., a system on a chip (SoC)), a microelectronic device combining logic and memory, and a graphics processing unit (GPU) incorporating memory.

As used herein, the term "configured" refers to a size, shape, material composition, orientation, and arrangement of one or more of at least one structure and at least one apparatus facilitating operation of one or more of the structure and the apparatus in a pre-determined way.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including conductive material.

As used herein, "insulative material" means and includes electrically insulative material, such as one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$—), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), at least one dielectric oxycarbide material (e.g., silicon oxycarbide ($SiO_xC_y$)), at least one hydrogenated dielectric oxycarbide material (e.g., hydrogenated silicon oxycarbide ($SiC_xO_yH_z$)), and at least one dielectric carboxynitride material (e.g., a silicon carboxynitride ($SiO_xC_zN_y$)). Formulae including one or more of "x" "y," and "z" herein (e.g., $SiO_x$, $AlO_x$, $HfO_x$, $NbO_x$, $TiO_x$, $SiN_y$, $SiO_xN_y$, $SiO_xC_y$, $SiC_xO_yH_z$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x", "y", "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature. The feature may, for example, be formed of and include a stack of at least two different materials.

Unless the context indicates otherwise, the materials described herein may be formed by any suitable technique including, but not limited to, spin coating, blanket coating, chemical vapor deposition (CVD), plasma enhanced CVD (PECVD), atomic layer deposition (ALD), plasma enhanced ALD (PEALD), physical vapor deposition (PVD) (e.g., sputtering), or epitaxial growth. Depending on the specific material to be formed, the technique for depositing or growing the material may be selected by a person of ordinary skill in the art. In addition, unless the context indicates otherwise, removal of materials described herein may be accomplished by any suitable technique including, but not limited to, etching (e.g., dry etching, wet etching, vapor etching), ion milling, abrasive planarization (e.g., chemical-mechanical planarization (CMP)), or other known methods.

FIGS. 1A through 1F are simplified, partial cross-sectional views illustrating different processing stages of a method of forming a microelectronic device (e.g., a memory device), in accordance with embodiments of the disclosure. The microelectronic device may be formed to include a combination of cross-point and 3D NAND Flash memory architectures. In addition, the microelectronic device may be formed to include multiple control logic regions including different control logic device configurations and operational functions than one another. With the description provided below, it will be readily apparent to one of ordinary skill in the art that the methods and structures described herein may be used to form various devices and electronic systems.

Referring to FIG. 1A, a microelectronic device structure 100 may be formed to include a semiconductive base structure 102, a first control logic region 104 at least partially over the semiconductive base structure 102, and a first memory array region 106 over the first control logic region 104. The first control logic region 104 includes a portion of the semiconductive base structure 102, as well as first transistors 108, and first contact structures 110. The first transistors 108, the first contact structures 110, and associated conductive routing structures may form control logic circuitry of various first control logic devices 112 of the first control logic region 104, as described in further detail below. The first memory array region 106 includes a stack structure 114, deep contact structures 116 and cell pillar structures 118 vertically extending through the stack structure 114, a source tier 120 under the stack structure 114, digit line structures 122 (e.g., bit line structures, data line structures) over the stack structure 114, insulative line structures 124 over the digit line structures 122, and second contact structures 126 (e.g., digit line contact structures) vertically extending through the insulative line structures 124 to the digit line structures 122. The microelectronic device structure 100 (including the semiconductive base structure 102, the first control logic region 104, and the first memory array region 106 thereof) includes additional features (e.g., structures, materials, devices), as described in further detail below.

The semiconductive base structure 102 comprises a base material or construction upon which additional features (e.g., materials, structures, devices) of the microelectronic device structure 100 are formed. The semiconductive base structure 102 may comprise a semiconductive structure (e.g., a semiconductive wafer), or a base semiconductive material on a supporting structure. For example, the semiconductive base structure 102 may comprise a conventional silicon substrate (e.g., a conventional silicon wafer), or another bulk substrate comprising a semiconductive material. In some embodiments, the semiconductive base structure 102 comprises a silicon wafer. The semiconductive base structure 102 may include one or more layers, structures, and/or regions formed therein and/or thereon.

As shown in FIG. 1A, one or more filled trenches 128 (e.g., filled openings, filled vias, filled apertures) may formed to vertically extend (e.g., in the Z-direction) partially (e.g., less than completely) through the semiconductive base structure 102. If formed, each of the filled trenches 128 may be formed to exhibit substantially the same dimensions and shape as each other of the filled trenches 128, or at least one of the filled trenches 128 may be formed to exhibit one or more of different dimensions and a different shape than at least one other of the filled trenches 128. As a non-limiting example, each of the filled trenches 128 may be formed to exhibit substantially the same vertical dimension(s) and substantially the same vertical cross-sectional shape(s) as each other of the filled trenches 128; or at least one of the filled trenches 128 may be formed to exhibit one or more of different vertical dimension(s) and different vertical cross-sectional shape(s) than at least one other of the filled trenches 128. In some embodiments, at least one of the filled trenches 128 is formed to vertically extend to and terminate at a relatively deeper depth within the semiconductive base structure 102 than at least one other of the filled trenches 128. In additional embodiments, the filled trenches 128 are all formed to vertically extend to and terminate at substantially the same depth within the semiconductive base structure 102. As another non-limiting example, each of the filled trenches 128 may be formed to exhibit substantially the same horizontal dimension(s) and substantially the same horizontal cross-sectional shape(s) as each other of the filled trenches 128; or at least one of the filled trenches 128 may be formed to exhibit one or more of different horizontal dimension(s) (e.g., relatively larger horizontal dimension(s), relatively smaller horizontal dimension(s)) and different horizontal cross-sectional shape(s) than at least one other of the filled trenches 128.

If formed, the filled trenches 128 may be substantially filled with one or more materials, such as one or more of at least one insulative material, at least one conductive material, and at least one semiconductive material. In some embodiments, at least one (e.g., each) of the filled trenches 128 is filled with at least one insulative material. At least one (e.g., each) of the filled trenches 128 may, for example, be employed as a shallow trench isolation (STI) structure within the semiconductive base structure 102. In additional embodiments, at least one (e.g., each) of the filled trenches 128 is filled with at least one conductive material. At least one of the filled trenches 128 may, for example, be employed to facilitate electrical connection between one or more components of the microelectronic device structure 100 at a first side (e.g., a front side, a top side) of the semiconductive base structure 102 and additional components (e.g., one or more structures and/or devices) to be provided at a second, opposing side (e.g., a back side, a bottom side) of the semiconductive base structure 102 following subsequent processing of the semiconductive base structure 102. In additional embodiments, the filled trenches 128 are omitted (e.g., absent) from the semiconductive base structure 102.

Still referring to FIG. 1A, the first transistors 108 of the first control logic region 104 may be formed to include conductively doped regions 132 (e.g., serving as source regions and drain regions of the first transistors 108) within the semiconductive base structure 102, channel regions 130 within the semiconductive base structure 102 and horizontally interposed between the conductively doped regions 132, and gate structures 134 vertically overlying the channel regions 130. The first transistors 108 may also include gate dielectric material (e.g., a dielectric oxide) formed to vertically intervene (e.g., in the Z-direction) between the gate structures 134 and the channel regions 130.

For the first transistors 108 of the first control logic region 104, the conductively doped regions 132 within the semiconductive base structure 102 may be doped with one or more desired dopants (e.g., chemical species). In some embodiments, the conductively doped regions 132 are doped with at least one N-type dopant (e.g., one or more of phosphorus (P), arsenic (As), antimony (Sb), and bismuth (Bi)). In some of such embodiments, the channel regions 130 within the semiconductive base structure 102 are doped with at least one P-type dopant (e.g., one or more of boron (B), aluminum (Al), and gallium (Ga)). In some other of such embodiments, the channel regions 130 within the semiconductive base structure 102 are substantially undoped. In additional embodiments, the conductively doped regions 132 are doped with at least one P-type dopant (e.g., one or more of B, Al, and Ga). In some of such additional embodiments, the channel regions 130 within the semiconductive base structure 102 are doped with at least one N-type dopant (e.g., one or more of P, As, Sb, and Bi). In some other of such additional embodiments, the channel regions 130 within the semiconductive base structure 102 are substantially undoped.

The gate structures 134 may individually horizontally extend (e.g., in the Y-direction) between and be employed by multiple first transistors 108 of the first control logic region 104. The gate structures 134 may be formed of and include conductive material. In some embodiments, the gate structures 134 are individually formed of and include W. The gate structures 134 may individually be substantially homogeneous, or the gate structures 134 may individually be heterogeneous. In some embodiments, the gate structures 134 are each substantially homogeneous. In additional embodiments, the gate structures 134 are each heterogeneous. Individual gate structures 134 may, for example, be formed of and include a stack of at least two different conductive materials.

Figure 1B:
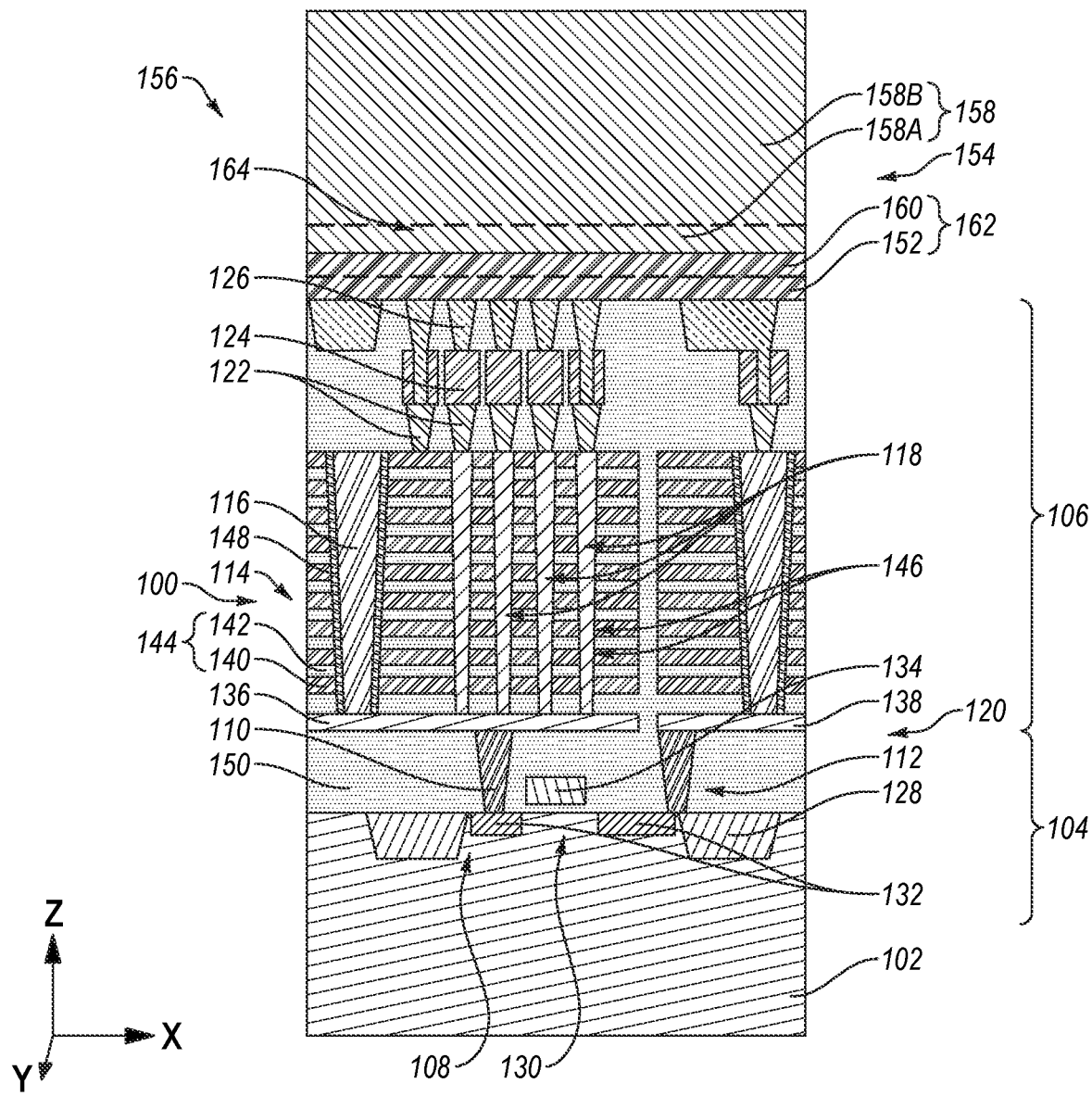
Figure 1C:
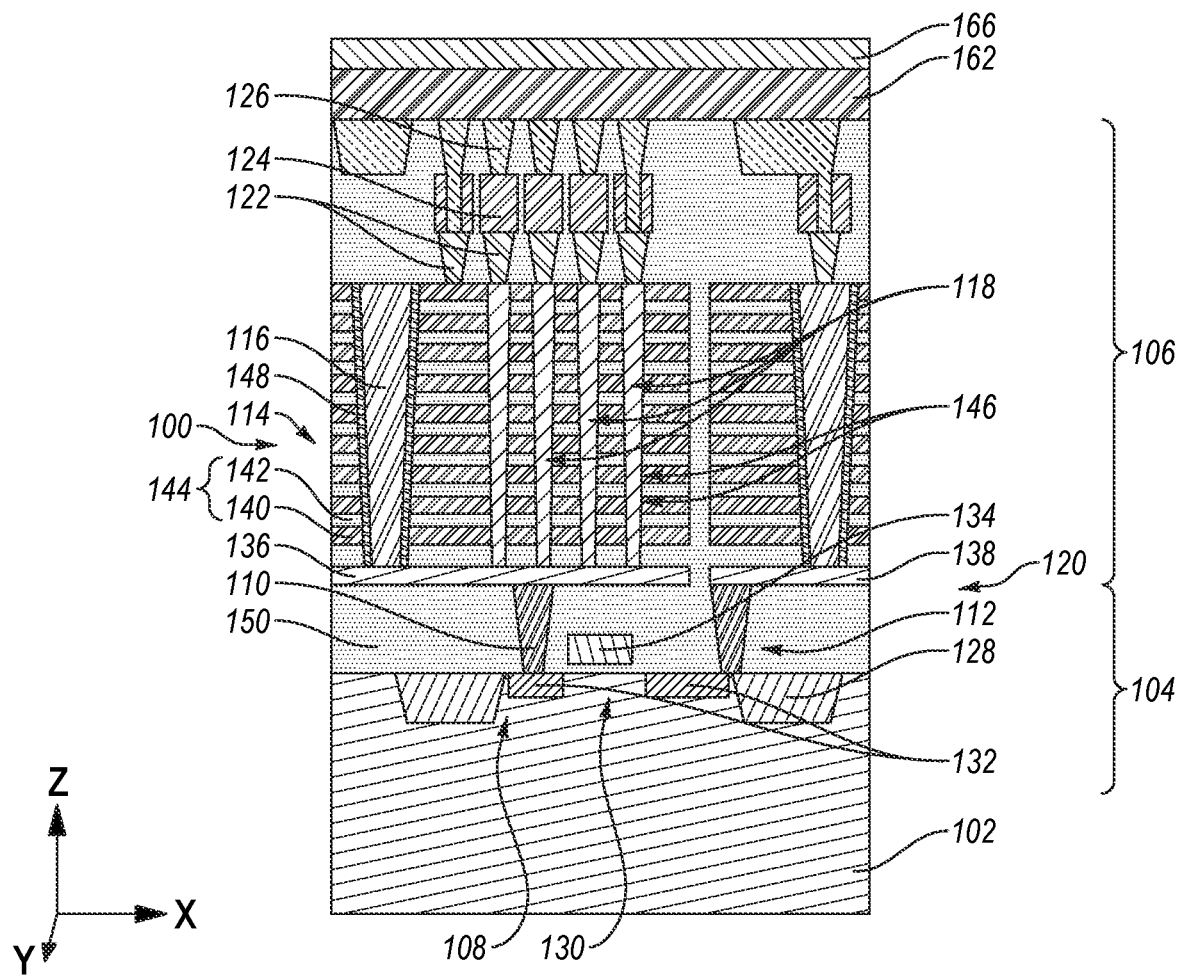

Still referring to FIG. 1C, the first contact structures 110 may be formed to vertically extend between and couple the conductively doped regions 132 within the semiconductive base structure 102 (and, hence, the first transistors 108) to one or more conductive routing structures of the first control logic region 104. The first contact structures 110 may each individually be formed of and include conductive material. By way of non-limiting example, the first contact structures 110 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, the first contact structures 110 are formed of and include W. In additional embodiments, the first contact structures 110 are formed of and include Cu.

As previously mentioned, the first transistors 108, the first contact structures 110, and conductive routing structures operatively associated therewith form control logic circuitry of various first control logic devices 112 of the first control logic region 104. In some embodiments, the first control logic devices 112 comprise complementary metal-oxide-semiconductor (CMOS) circuitry. The first control logic devices 112 may be configured to control various operations of components (e.g., components within the first memory array region 106, components of at least one additional memory array region to subsequently be formed) of a microelectronic device (e.g., a memory device) formed to include to the microelectronic device structure 100. The first control logic devices 112 included in the first control logic region 104 may be selected relative to additional control logic devices (e.g., second control logic devices) included in the one or more additional control logic region(s) to subsequently be formed, as described in further detail below. Configurations of the first control logic devices 112 included in the first control logic region 104 may be different than configurations of additional control logic devices included in the additional control logic region(s). In some embodiments, the additional control logic devices included in the additional control logic region(s) comprise relatively high performance control logic devices employing relatively high performance control logic circuitry (e.g., relatively high performance CMOS circuitry); and the first control logic devices 112 included in the first control logic region 104 employ relatively lower performance control logic circuitry (e.g., additional CMOS circuitry). The additional control logic devices within the additional control logic region(s) may, for example, be configured to operate at applied voltages less than or equal to (e.g., less than) about 1.4 volts (V), such as within a range of from about 0.7 V to about 1.4 V (e.g., from about 0.7 V to about 1.3 V, from about 0.7 V to about 1.2 V, from about 0.9 V to about 1.2 V, from about 0.95 V to about 1.15 V, or about 1.1 V); and the first control logic devices 112 within the first control logic region 104 may be configured to operate at applied voltages above upper operational voltages of additional control logic devices within the additional control logic regions(s), such as at applied voltages greater than about 1.2 V (e.g., greater than or equal to about 1.3 V, greater than or equal to about 1.4 V).

As a non-limiting example, the first control logic devices 112 included within the first control logic region 104 of the microelectronic device structure 100 may include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), drain supply voltage ($V_{dd}$) regulators, string drivers, page buffers, and various chip/deck control circuitry. As another non-limiting example, the first control logic devices 112 may include devices configured to control column operations for arrays (e.g., memory arrays) within one or more (e.g., each) of the first memory array region 106 and one or more additional memory array region(s) to subsequently be formed, such as one or more (e.g., each) of decoders (e.g., local deck decoders, column decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry), I/O devices (e.g., local I/O devices), memory test devices, array multiplexers (MUX), and error checking and correction (ECC) devices. As a further non-limiting example, the first control logic devices 112 may include devices configured to control row operations for arrays (e.g., memory arrays) within one or more (e.g., each) of the first memory array region 106 and the additional memory array region(s) to subsequently be formed, such as one or more (e.g., each) of decoders (e.g., local deck decoders, row decoders), drivers (e.g., word line (WL) drivers), repair circuitry (e.g., row repair circuitry), memory test devices, MUX, ECC devices, and self-refresh/wear leveling devices.

With continued reference to FIG. 1A, the source tier 120 may be vertically interposed between the first control logic devices 112 of the first control logic region 104 and the stack structure 114 of the first memory array region 106 overlying the first control logic region 104. The source tier 120 may include at least one source structure 136 (e.g., a source plate), and at least one contact pad 138. The source structure (s) 136 and the contact pad(s) 138 may horizontally neighbor one another (e.g., in the X-direction, in the Y-direction) within the source tier 120. The source structure(s) 136 may be electrically isolated from the contact pad(s) 138, and may be positioned at substantially the same vertical position (e.g., in the Z-direction) as the contact pad(s) 138. At least one insulative material (e.g., a portion of the isolation material 150) may be interposed between the source structure(s) 136 and the contact pad(s) 138 of the source tier 120.

The source structure(s) 136 and the contact pad(s) 138 of the source tier 120 may each be formed of and include conductive material. A material composition of the source structure(s) 136 may be substantially the same as a material composition of the contact pad(s) 138. In some embodiments, the source structure(s) 136 and the contact pad(s) 138 are formed of and include one or more of a metal, an alloy, and a conductive metal-containing material (e.g., a conductive metal nitride, a conductive metal silicide, a conductive metal carbide, a conductive metal oxide). As a non-limiting example, the source structure(s) 136 and the contact pad(s) 138 may be formed of and include W. In additional embodiments, the source structure(s) 136 and the contact pad(s) 138 are formed of and include conductively doped semiconductive material, such as a conductively doped form of one or more of a silicon material, such as monocrystalline silicon or polycrystalline silicon; a silicon-germanium material; a germanium material; a gallium arsenide material; a germanium material; a gallium arsenide material; a gallium nitride material; and an indium phosphide material. As a non-limiting example, the source structure(s) 136 and the contact pad(s) 138 may be formed of and include silicon (e.g., polycrystalline silicon) doped with at least one dopant (e.g., one or more of at least one n-type dopant, at least one p-type dopant, and at least another dopant).

As shown in FIG. 1A, the source structure(s) 136 and the contact pad(s) 138 of the source tier 120 may be coupled to control logic circuitry (including first transistors 108 and first contact structures 110 thereof) of the first control logic devices 112 of the first control logic region 104. The source structure(s) 136 and the contact pad(s) 138 of the source tier 120 may also individually be coupled to one or more of the deep contact structures 116 of the first memory array region 106. In addition, the source structure(s) 136 of the source tier 120 may be coupled to the cell pillar structures 118 of the first memory array region 106. In some embodiments, the source structure(s) 136 directly physically contacts the cell pillar structures 118. In additional embodiments, contact structures may vertically intervene between the source structure(s) 136 and the cell pillar structures 118.

Still referring to FIG. 1A, the stack structure 114 of the first memory array region 106 may be formed to vertically overlie the source tier 120, and may include a vertically alternating (e.g., in the Z-direction) sequence of conductive structures 140 and insulative structures 142 arranged in tiers 144. Each of the tiers 144 of the stack structure 114 may include at least one of the conductive structures 140 vertically neighboring at least one of the insulative structures 142. The stack structure 114 may be formed to include any desired number of the tiers 144, such as greater than or equal to sixteen (16) of the tiers 144, greater than or equal to thirty-two (32) of the tiers 144, greater than or equal to sixty-four (64) of the tiers 144, greater than or equal to one hundred and twenty-eight (128) of the tiers 144, or greater than or equal to two hundred and fifty-six (256) of the tiers 144.

The conductive structures 140 of the tiers 144 of the stack structure 114 may be formed of and include conductive material. By way of non-limiting example, the conductive structures 140 may each individually be formed of and include a metallic material comprising one or more of at least one metal, at least one alloy, and at least one conductive metal-containing material (e.g., a conductive metal nitride, a conductive metal silicide, a conductive metal carbide, a conductive metal oxide). In some embodiments, the conductive structures 140 are formed of and include W. Each of the conductive structures 140 may individually be substantially homogeneous, or one or more of the conductive structures 140 may individually be substantially heterogeneous. In some embodiments, each of the conductive structures 140 is formed to be substantially homogeneous. In additional embodiments, each of the conductive structures 140 is formed to be heterogeneous. Each conductive structure 140 may, for example, be formed of and include a stack of at least two different conductive materials.

Optionally, one or more liner materials (e.g., insulative liner material(s), conductive liner material(s)) may also be formed around the conductive structures 140. The liner material(s) may, for example, be formed of and include one or more of a metal (e.g., titanium, tantalum), an alloy, a metal nitride (e.g., tungsten nitride, titanium nitride, tantalum nitride), and a metal oxide (e.g., aluminum oxide). In some embodiments, the liner material(s) comprise at least one conductive material employed as a seed material for the formation of the conductive structures 140. In some embodiments, the liner material(s) comprise titanium nitride. In further embodiments, the liner material(s) further includes aluminum oxide. As a non-limiting example, aluminum oxide may be formed directly adjacent the insulative structures 142, titanium nitride may be formed directly adjacent the aluminum oxide, and tungsten may be formed directly adjacent the titanium nitride. For clarity and ease of understanding the description, the liner material(s) are not illustrated in FIG. 1A, but it will be understood that the liner material(s) may be disposed around the conductive structures 140.

The insulative structures 142 of the tiers 144 of the stack structure 114 may be formed of and include at least one insulative material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, each of the insulative structures 142 is formed of and includes a dielectric oxide material, such as $SiO_x$ (e.g., $SiO_2$). Each of the insulative structures 142 may individually be substantially homogeneous, may be substantially heterogeneous. In some embodiments, each of the insulative structures 142 is substantially homogeneous. In further embodiments, at least one of the insulative structures 142 is substantially heterogeneous. One or more of the insulative structures 142 may, for example, be formed of and include a stack (e.g., laminate) of at least two different insulative materials.

The cell pillar structures 118 may vertically extend through the tiers 144 of the stack structure 114. The cell pillar structures 118 may each individually be formed of and include a stack of materials. By way of non-limiting example, each of the cell pillar structures 118 may be formed to include a charge-blocking material, such as first dielectric oxide material (e.g., $SiO_x$, such as $SiO_2$; $AlO_x$, such as $Al_2O_3$); a charge-trapping material, such as a dielectric nitride material (e.g., $SiN_y$, such as $Si_3N_4$); a tunnel dielectric material, such as a second oxide dielectric material (e.g., $SiO_x$, such as $SiO_2$); a channel material, such as a semiconductive material (e.g., silicon, such as polycrystalline Si); and a dielectric fill material (e.g., a dielectric oxide, a dielectric nitride, air). The charge-blocking material may be formed on or over surfaces of the conductive structures 140 and the insulative structures 142 of the tiers 144 of stack structure 114 at least partially defining horizontal boundaries of the cell pillar structures 118; the charge-trapping material may be horizontally surrounded by the charge-blocking material; the tunnel dielectric material may be horizontally surrounded by the charge-trapping material; the channel material may be horizontally surrounded by the tunnel dielectric material; and the dielectric fill material may be horizontally surrounded by the channel material.

With continued reference to FIG. 1A, intersections of the cell pillar structures 118 and the conductive structures 140 of the tiers 144 of the stack structure 114 may define vertically extending strings of memory cells 146 coupled in series with one another within the stack structure 114. In some embodiments, the memory cells 146 formed at the intersections of the conductive structures 140 and the cell pillar structures 118 within different tiers 144 of the stack structure 114 comprise so-called "MONOS" (metal-oxide-nitride-oxide-semiconductor) memory cells. In additional embodiments, the memory cells 146 comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In further embodiments, the memory cells 146 comprise so-called "floating gate" memory cells including floating gates (e.g., metallic floating gates) as charge storage structures. The floating gates may horizontally intervene between central structures of the cell pillar structures 118 and the conductive structures 140 of the different tiers 144 of the stack structure 114.

As shown in FIG. 1A, the deep contact structures 116 may also vertically extend through the tiers 144 of the stack structure 114. The deep contact structures 116 may be configured and positioned to electrically connect one or more features (e.g., structures, material, devices) of the microelectronic device structure 100 vertically overlying the stack structure 114 with one or more additional features of the microelectronic device structure 100 vertically underlying the stack structure 114. The deep contact structures 116 may be formed of and include conductive material. In some embodiments, the deep contact structures 116 are formed of and include W. In additional embodiments, the deep contact structures 116 are formed of and include conductively doped polycrystalline silicon.

Still referring to FIG. 1A, insulative liner structures 148 may be formed to substantially continuously extend over and substantially cover side surfaces of the deep contact structures 116. The insulative liner structures 148 may be horizontally interposed between the deep contact structures 116 and the conductive structures 140 (and the insulative structures 142) of the tiers 144 of the stack structure 114. The insulative liner structures 148 may be formed over and include at least one insulative material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and a $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, each of the insulative liner structures 148 is formed of and includes at least one dielectric oxide material (e.g., $SiO_x$, such as $SiO_2$).

The digit line structures 122 may be formed vertically over and in electrical communication with the cell pillar structures 118 (and, hence, the vertically extending strings of memory cells 146) and the deep contact structures 116. The digit line structures 122 may exhibit horizontally elongate shapes extending in parallel in a first horizontal direction (e.g., the Y-direction). As used herein, the term "parallel" means substantially parallel. The digit line structures 122 may each exhibit substantially the same dimensions (e.g., width in the X-direction, length in a Y-direction, height in the Z-direction), shape, and spacing (e.g., in the X-direction). In additional embodiments, one or more of the digit line structures 122 may exhibit one or more of at least one different dimension (e.g., a different length, a different width, a different height) and a different shape than one or more other of the digit line structures 122, and/or the spacing (e.g., in the X-direction) between at least two horizontally neighboring digit line structures 122 may be different than the spacing between at least two other horizontally neighboring digit line structures 122.

The digit line structures 122 may be formed of and include conductive material. By way of non-limiting example, the digit line structures 122 may each individually be formed of and include a metallic material comprising one or more of at least one metal, at least one alloy, and at least one conductive metal-containing material (e.g., a conductive metal nitride, a conductive metal silicide, a conductive metal carbide, a conductive metal oxide). In some embodiments, the digit line structures 122 are each individually formed of and include W. Each of the digit line structures 122 may individually be substantially homogeneous, or one or more of the digit line structures 122 may individually be substantially heterogeneous. In some embodiments, each of the digit line structures 122 is substantially homogeneous. In additional embodiments, each of the digit line structures 122 is heterogeneous. Each digit line structure 122 may, for example, be formed of and include a stack of at least two different conductive materials.

The insulative line structures 124 may be formed on or over the digit line structures 122. The insulative line structures 124 may serve as insulative cap structures (e.g., dielectric cap structures) for the digit line structures 122. The insulative line structures 124 may have horizontally elongate shapes extending in parallel in the first horizontal direction (e.g., the Y-direction). Horizontal dimensions, horizontal pathing, and horizontal spacing of the insulative line structures 124 may be substantially the same as the horizontal dimensions, horizontal pathing, and horizontal spacing of the digit line structures 122.

The insulative line structures 124 may be formed of and include insulative material. By way of non-limiting example, the insulative line structures 124 may each individually be formed of and include a dielectric nitride material, such as $SiN_y$ (e.g., $Si_3N_4$). The insulative line structures 124 may each be substantially homogeneous, or one or more of the insulative line structures 124 may be heterogeneous. In some embodiments, each of the insulative line structures 124 is substantially homogeneous. In additional embodiments, each of the insulative line structures 124 is heterogeneous. Each insulative line structure 124 may, for example, be formed of and include a stack of at least two different dielectric materials.

The second contact structures 126 may be formed to vertically extend through the insulative line structures 124, and may contact the digit line structures 122. For each digit line contact structure 122, a first portion thereof may vertically overlie one of the insulative line structures 124, and a second portion thereof may vertically extend through the insulative line structure 124 and contact (e.g., physically contact, electrically contact) one of the digit line structures 122. The individual second contact structures 126 may be at least partially (e.g., substantially) horizontally aligned in the X-direction with individual insulative line structures 124 (and, hence, individual digit line structures 122). For example, horizontal centerlines of the second contact structures 126 in the X-direction may be substantially aligned with horizontal centerlines of the insulative line structures 124 in the X-direction. In addition, the second contact structures 126 may be formed at desired locations in the Y-direction along the insulative line structures 124 (and, hence, the digit line structures 122). In some embodiments, at least some of the second contact structures 126 are provided at different positions in the Y-direction than one another. For example, a first of the second contact structures 126 may be provided at different position along a length in the Y-direction of a first of the insulative line structures 124 as compared to a position of a second of the second contact structures 126 along a length in the Y-direction of a second of the insulative line structures 124. Put another way, at least some (e.g., all) of the second contact structures 126 may be horizontally offset from one another in the Y-direction. In additional embodiments, two or more of the second contact structures 126 are horizontally aligned with one another in the Y-direction. In some embodiments, the second contact structures 126 are employed as digit line contact structures (e.g., data line contact structures, bit line contact structures) for a microelectronic device (e.g., a memory device) to be formed using the microelectronic device structure 100.

The second contact structures 126 may each individually be formed of and include conductive material. By way of non-limiting example, the second contact structures 126 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, the second contact structures 126 are formed of and include Cu. In additional embodiments, the second contact structures 126 are formed of and include W.

Still referring to FIG. 1A, at least one isolation material 150 may be formed to cover and surround of portions of the semiconductive base structure 102, the first transistors 108, the first contact structures 110, the source structure(s) 136, the contact pad(s) 138, stack structure 114 (including the conductive structures 140 and the insulative structures 142 thereof), the digit line structures 122, the insulative line structures 124, and the second contact structures 126. The isolation material 150 may be formed of and include at least one insulative material. By way of non-limiting example, the isolation material 150 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, and $TiO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the isolation material 150 is formed of and includes $SiO_x$ (e.g., $SiO_2$). The isolation material 150 may be substantially homogeneous, or the isolation material 150 may be heterogeneous. If the isolation material 150 is heterogeneous, amounts of one or more elements included in the isolation material 150 may vary stepwise (e.g., change abruptly), or may vary continuously (e.g., change progressively, such as linearly, parabolically) throughout different portions of the isolation material 150. In some embodiments, the isolation material 150 is substantially homogeneous. In additional embodiments, the isolation material 150 is heterogeneous. The isolation material 150 may, for example, be formed of and include a stack of at least two different dielectric materials.

With continued reference to FIG. 1A, at least one dielectric structure 152 may be formed on or over upper surfaces of the second contact structures 126. The dielectric structure 152 may exhibit a substantially planar upper surface, and may be employed for a subsequent bonding process, as described in further detail below. The dielectric structure 152 may be formed of and include at least one insulative material. A material composition of the dielectric structure 152 may be substantially the same as a material composition of the isolation material 150, or may be different than the material composition of the isolation material 150. The dielectric structure 152 may comprise a portion of the isolation material 150 vertically overlying upper surfaces of the second contact structures 126, or may comprise an additional structure formed on or over upper surfaces of the second contact structures 126 and the isolation material 150. In some embodiments, the dielectric structure 152 is formed of and includes a dielectric oxide material, such as SiO$_x$ (e.g., SiO$_2$). The dielectric structure 152 may be substantially homogeneous, or the dielectric structure 152 may be heterogeneous. In some embodiments, the dielectric structure 152 is substantially homogeneous. In additional embodiments, the dielectric structure 152 is heterogeneous. The dielectric structure 152 may, for example, be formed of and include a stack of at least two different dielectric materials.

Referring next to FIG. 1B, the microelectronic device structure 100 may be attached (e.g., bonded) to an additional microelectronic device structure 154 to form a microelectronic device structure assembly 156. The additional microelectronic device structure 154 may include an additional semiconductive base structure 158 and an additional dielectric structure 160 formed on, over, or within the additional semiconductive base structure 158. As shown in FIG. 1B, the additional microelectronic device structure 154 may be vertically inverted (e.g., flipped upside down in the Z-direction) and the additional dielectric structure 160 thereof may be attached (e.g., bonded, such as through oxide-oxide bonding) to the dielectric structure 152 of the microelectronic device structure 100 to form the microelectronic device structure assembly 156. Attaching (e.g., bonding) the additional dielectric structure 160 of the additional microelectronic device structure 154 to the dielectric structure 152 of the microelectronic device structure 100 may form a connected dielectric structure 162 of the microelectronic device structure assembly 156. Alternatively, the microelectronic device structure 100 may be vertically inverted (e.g., flipped upside down in the Z-direction) and attached to the additional microelectronic device structure 154 to form the microelectronic device structure assembly 156.

The additional semiconductive base structure 158 of the additional microelectronic device structure 154 comprises a base material or construction upon which additional features (e.g., materials, structures, devices) are formed. In some embodiments, the additional semiconductive base structure 158 comprises a wafer. The additional semiconductive base structure 158 may be formed of and include a semiconductive material (e.g., one or more of a silicon material, as monocrystalline silicon or polycrystalline silicon (also referred to herein as "polysilicon"); silicon-germanium; germanium; gallium arsenide; a gallium nitride; gallium phosphide; indium phosphide; indium gallium nitride; and aluminum gallium nitride). By way of non-limiting example, the additional semiconductive base structure 158 may comprise a semiconductive wafer (e.g., a silicon wafer). The additional semiconductive base structure 158 may include one or more layers, structures, and/or regions formed therein and/or thereon.

As shown in FIG. 1B, optionally, the additional semiconductive base structure 158 may include at least one detachment region 164 therein configured to promote or facilitate detachment of a portion 158A of the additional semiconductive base structure 158 proximate (e.g., adjacent) the additional dielectric structure 160 from an additional portion 158B of the additional semiconductive base structure 158 relative more distal from the additional dielectric structure 160. By way of non-limiting example, the detachment region 164 may include one one or more of dopants (e.g., hydrogen), void spaces, and/or structural features (e.g., defects, damage) promoting or facilitating subsequent detachment of the portion 158A from the additional portion 158B, as described in further detail below. The vertical depth (e.g., in the Z-direction) of the detachment region 164 within the additional semiconductive base structure 158 may correspond to desired vertical height of the portion 158A of the additional semiconductive base structure 158. The vertical height of the portion 158A may be selected at least partially based on desired configuration of additional features (e.g., structures, materials, devices) to be formed using the portion 158A of the additional semiconductive base structure 158 following the detachment thereof from the additional portion 158B of the additional semiconductive base structure 158. In additional embodiments, the detachment region 164 is absent from the additional semiconductive base structure 158. In some of such embodiments, the additional portion 158B of the additional semiconductive base structure 158 may subsequently be removed relative to the portion 158A of the additional semiconductive base structure 158 through a different process (e.g., a non-detachment-based process, such as a conventional grinding process).

The additional dielectric structure 160 of the additional microelectronic device structure 154 may be formed of and include at least one insulative material. A material composition of the additional dielectric structure 160 of the additional microelectronic device structure 154 may be substantially the same as a material composition of the dielectric structure 152 of the microelectronic device structure 100, or may be different than the material composition of the dielectric structure 152 of the microelectronic device structure 100. In some embodiments, the additional dielectric structure 160 is formed of and includes a dielectric oxide material, such as SiO$_x$ (e.g., SiO$_2$). The additional dielectric structure 160 may be substantially homogeneous, or the additional dielectric structure 160 may be heterogeneous. In some embodiments, the additional dielectric structure 160 is substantially homogeneous. In additional embodiments, the additional dielectric structure 160 is heterogeneous. The additional dielectric structure 160 may, for example, be formed of and include a stack of at least two different dielectric materials.

While in FIG. 1B, the dielectric structure 152 and the additional dielectric structure 160 of the connected dielectric structure 162 of the microelectronic device structure assembly 156 are distinguished from one another by way of a dashed line, the dielectric structure 152 and the additional dielectric structure 160 may be integral and continuous with one another. Put another way, the connected dielectric structure 162 may be a substantially monolithic structure including the dielectric structure 152 as a first region (e.g., a vertically lower region) thereof, and the additional dielectric structure 160 as a second region (e.g., a vertically upper region) thereof. For the connected dielectric structure 162, the dielectric structure 152 thereof may be attached to the additional dielectric structure 160 thereof without a bond line.

Referring next to FIG. 1C, the additional portion 158B (FIG. 1B) of the additional semiconductive base structure 158 (FIG. 1B) is removed while at least partially maintaining the portion 158A (FIG. 1B) of the additional semiconductive base structure 158 (FIG. 1B) to form a semiconductive structure 166. The semiconductive structure 166 may comprise semiconductive material of the portion 158A (FIG. 1B) remaining (e.g., unremoved, maintained) following the removal of the additional portion 158B (FIG. 1B) of the additional semiconductive base structure 158 (FIG. 1B). A vertical dimension (e.g., height in the Z-direction) of the semiconductive structure 166 may be less than or equal to a vertical dimension of the portion 158A (FIG. 1B) of the additional semiconductive base structure 158 (FIG. 1B). The semiconductive structure 166 may be employed to form features (e.g., structures; devices, such as second transistors) of a second control logic region to be formed over the first memory array region 106, as described in further detail below.

The additional portion 158B (FIG. 1B) of the additional semiconductive base structure 158 (FIG. 1B) may be removed using conventional processes (e.g., a detachment process; a wafer thinning process, such as a grinding processes) and conventional processing equipment, which are not described in detail herein. By way of non-limiting example, in some embodiments wherein the additional semiconductive base structure 158 (FIG. 1B) includes the detachment region 164 (FIG. 1B) including one or more of dopants (e.g., hydrogen), void spaces, and/or structural features (e.g., defects, damage) promoting or facilitating subsequent detachment of the portion 158A (FIG. 1B) from the additional portion 158B (FIG. 1B), the additional semiconductive base structure 158 (FIG. 1B) may be acted upon to effectuate such detachment at or proximate the detachment region 164 (FIG. 1B)

Figure 1D:
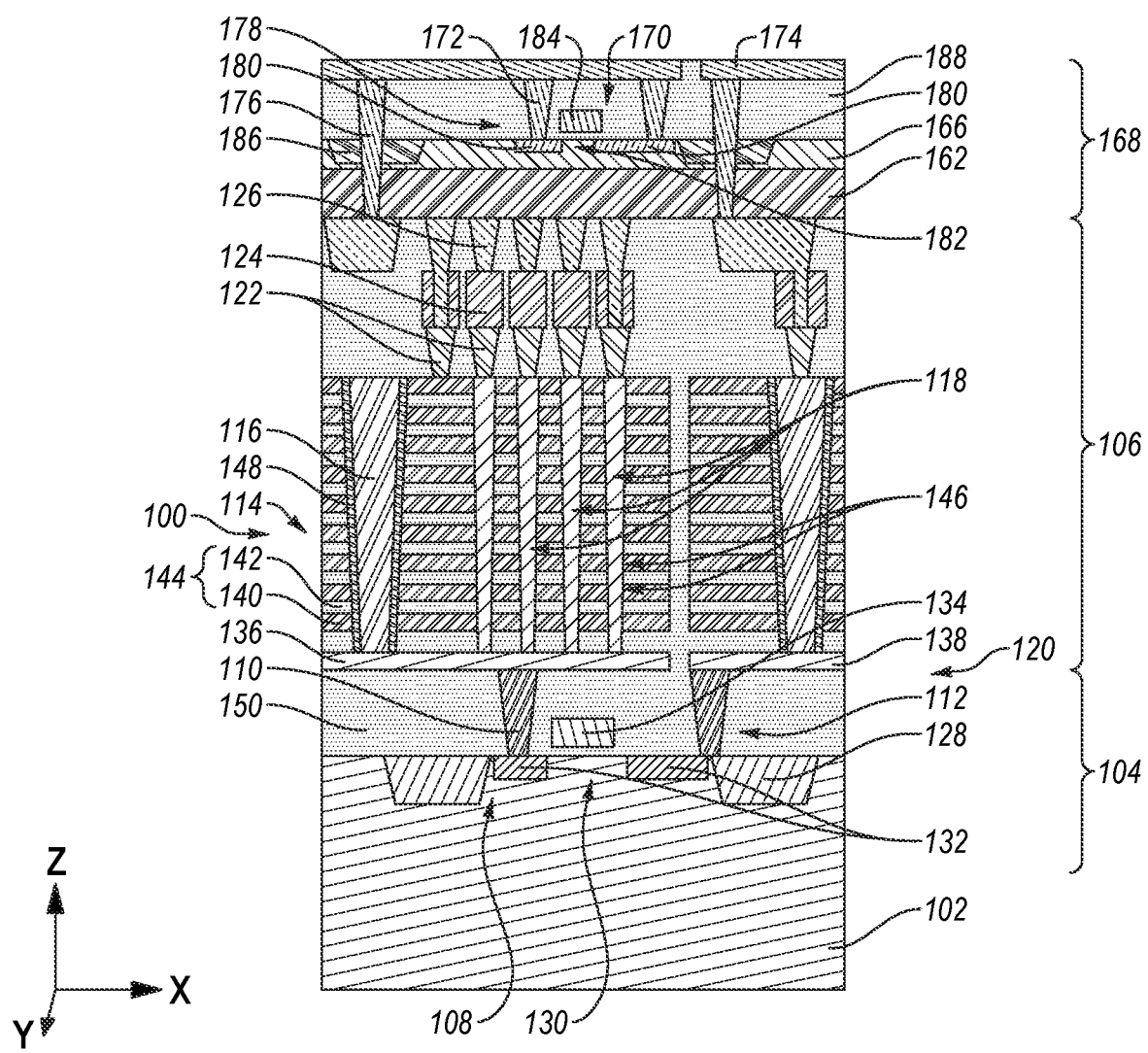

Referring next to FIG. 1D, a second control logic region 168 may be formed over the first memory array region 106 of the microelectronic device structure 100. As shown in FIG. 1D, the second control logic region 168 may include the semiconductive structure 166. Optionally, an additional amount (e.g., additional volume) of semiconductive material (e.g., polycrystalline silicon) may be formed on the semiconductive structure 166. In addition, the second control logic region 168 is formed to include second transistors 170, third contact structures 172, conductive routing structures 174, and fourth contact structures 176. At least the second transistors 170, the third contact structures 172, and the conductive routing structures 174 may form additional control logic circuitry of various second control logic devices 178 of the second control logic region 168, as described in further detail below. The second control logic region 168 may be formed to further include additional features (e.g., structures, materials, devices), as also described in further detail below.

The second transistors 170 of the second control logic region 168 may be formed to include additional conductively doped regions 180 (e.g., serving as source regions and drain regions of the second transistors 170) within the semiconductive structure 166, additional channel regions 182 within the semiconductive structure 166 and horizontally interposed between the additional conductively doped regions 180, and additional gate structures 184 vertically overlying the additional channel regions 182. The second transistors 170 may also include additional gate dielectric material (e.g., additional dielectric oxide) formed to vertically intervene (e.g., in the Z-direction) between the additional gate structures 184 and the additional channel regions 182.

For the second transistors 170 of the second control logic region 168, the additional conductively doped regions 180 within the semiconductive structure 166 may be doped with one or more desired dopants (e.g., chemical species). In some embodiments, the additional conductively doped regions 180 are doped with at least one N-type dopant (e.g., one or more of P, As, Sb, and Bi). In some of such embodiments, the additional channel regions 182 within the semiconductive structure 166 are doped with at least one P-type dopant (e.g., one or more of B, Al, and Ga). In some other of such embodiments, the additional channel regions 182 within the semiconductive structure 166 are substantially undoped. In additional embodiments, the additional conductively doped regions 180 are doped with at least one P-type dopant (e.g., one or more of B, Al, and Ga). In some of such additional embodiments, the additional channel regions 182 within the semiconductive structure 166 are doped with at least one N-type dopant (e.g., one or more of P, As, Sb, and Bi). In some other of such additional embodiments, the additional channel regions 182 within the semiconductive structure 166 are substantially undoped.

The additional gate structures 184 may individually horizontally extend (e.g., in the Y-direction) between and be employed by multiple second transistors 170 of the second control logic region 168. The additional gate structures 184 may be formed of and include conductive material. In some embodiments, the additional gate structures 184 are individually formed of and include W. The additional gate structures 184 may individually be substantially homogeneous, or the additional gate structures 184 may individually be heterogeneous. In some embodiments, the additional gate structures 184 are each substantially homogeneous. In additional embodiments, the additional gate structures 184 are each heterogeneous. Individual additional gate structures 184 may, for example, be formed of and include a stack of at least two different conductive materials.

Still referring to FIG. 1D, the third contact structures 172 may be formed to vertically extend between and couple the additional conductively doped regions 180 within the semiconductive structure 166 (and, hence, the second transistors 170) to one or more of the conductive routing structures 174 of the second control logic region 168. The third contact structures 172 may each individually be formed of and include conductive material. By way of non-limiting example, the third contact structures 172 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, the third contact structures 172 are formed of and include W. In additional embodiments, the third contact structures 172 are formed of and include Cu.

The conductive routing structures 174 may be formed over (e.g., in the Z-direction) and in electrical communication with the third contact structures 172 and the second transistors 170 of the second control logic region 168. The conductive routing structures 174 may each individually be formed of and include conductive material. By way of non-limiting example, the conductive routing structures 174 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, the conductive routing structures 174 are formed of and include Cu. In additional embodiments, the conductive routing structures 174 are formed of and include W.

As previously mentioned, the second transistors 170, the third contact structures 172, and the conductive routing structures 174 form additional control logic circuitry of various second control logic devices 178 of the second control logic region 168. In some embodiments, the second control logic devices 178 comprise CMOS circuitry. The second control logic devices 178 may be configured to control various operations of components within the first memory array region 106 as well as components within one or more additional memory array region(s) (e.g., a second memory array region) to subsequently be formed over the second control logic region 168. The second control logic devices 178 may be different than (e.g., may have different configurations and operational functions than) the first control logic devices 112. In some embodiments, the second control logic devices 178 include relatively high performance control logic devices employing relatively high performance control logic circuitry (e.g., relatively high performance CMOS circuitry). The second control logic devices 178 may, for example, be configured to operate at applied voltages less than or equal to (e.g., less than) about 1.4 volts (V), such as within a range of from about 0.7V to about 1.4V (e.g., from about 0.9V to about 1.2V, from about 0.95V to about 1.15V, or about 1.1V).

As a non-limiting example, the second control logic devices 178 included within the second control logic region 168 may include devices configured to control column operations for arrays (e.g., memory arrays) within one or more (e.g., each) of the first memory array region 106 and a second memory array region to subsequently be formed, such as one or more (e.g., each) of decoders (e.g., local deck decoders, column decoders), sense amplifiers (e.g., EQ amplifiers, ISO amplifiers, NSAs, PSAs), repair circuitry (e.g., column repair circuitry), I/O devices (e.g., local I/O devices), memory test devices, MUX, and ECC devices. As another non-limiting example, the second control logic devices 178 may include devices configured to control row operations for arrays (e.g., memory arrays) within one or more (e.g., each) of the first memory array region 106 (FIG. 1A) and the second memory array region to subsequently be formed, such as one or more (e.g., each) of decoders (e.g., local deck decoders, row decoders), drivers (e.g., WL drivers), repair circuitry (e.g., row repair circuitry), memory test devices, MUX, ECC devices, and self-refresh/wear leveling devices. As a further non-limiting example, the second control logic devices 178 may include one or more of string drivers and page buffers.

Still referring to FIG. 1D, one or more additional filled trenches 186 (e.g., filled openings, filled vias, filled apertures) may be formed to vertically extend (e.g., in the Z-direction) at least partially (e.g., substantially) through the semiconductive structure 166. If formed, each of the additional filled trenches 186 may be formed to exhibit substantially the same dimensions (e.g., substantially the same horizontal dimensions, substantially the same vertical dimensions) and shape (e.g., substantially the same horizontal cross-sectional shape, substantially the same vertical cross-sectional shape) as each other of the additional filled trenches 186, or at least one of the additional filled trenches 186 may be formed to exhibit one or more of different dimensions (e.g., one or more different horizontal dimensions, one or more different vertical dimensions) and a different shape (e.g., a different horizontal cross-sectional shape, a different vertical cross-sectional shape) than at least one other of the additional filled trenches 186.

If formed, the additional filled trenches 186 may be substantially filled with one or more materials, such as one or more of at least one insulative material, at least one conductive material, and at least one semiconductive material. In some embodiments, at least one (e.g., each) of the additional filled trenches 186 is filled with at least one insulative material. At least one (e.g., each) of the additional filled trenches 186 may, for example, be employed as a STI structure within the semiconductive structure 166. In additional embodiments, the additional filled trenches 186 are not formed in (e.g., are omitted from) from the semiconductive structure 166.

With continued reference to FIG. 1D, the fourth contact structures 176 may be formed to vertically extend from one or more of the conductive routing structures 174 and through the semiconductive structure 166. The fourth contact structures 176 may individually be coupled to at least one the second contact structures 126 of the first memory array region 106. The fourth contact structures 176 may at least partially fill vias (e.g., through silicon vias (TSVs), through STI vias) formed to vertically extend from the conductive routing structures 174, through the semiconductive structure 166, and to the second contact structures 126 of the first memory array region 106. One or more of the fourth contact structures 176 may be formed to vertically extend through one or more of the additional filled trenches 186 (e.g., STI structures) formed within the semiconductive structure 166. Optionally, one or more other of the fourth contact structures 176 may be formed to vertically extend through one or more other regions of the semiconductive structure 166 outside of horizontal boundaries of the additional filled trenches 186.

The fourth contact structures 176 may be formed of and include conductive material. The fourth contact structures 176 may facilitate electrical communications between the second control logic devices 178 of the second control logic region 168 and components of the first memory array region 106 and the first control logic region 104 thereunder, such as the vertically extending strings of memory cells 146 within the first memory array region 106 and the first control logic devices 112 within the first control logic region 104. In some embodiments, the fourth contact structures 176 may each individually comprise metallic material, such as one or more of at least one metal, at least one alloy, and at least one conductive metal-containing material (e.g., a conductive metal nitride, a conductive metal silicide, a conductive metal carbide, a conductive metal oxide). In some embodiments, the fourth contact structures 176 are formed of and include W.

Optionally, at least one insulative liner material may be formed to substantially continuously extend over and substantially cover side surfaces of one or more of the fourth contact structures 176. The insulative liner material may partially fill one or more vias (e.g., one or more TSVs) containing the one or more of the fourth contact structures 176. The insulative liner material may be horizontally interposed between the fourth contact structure(s) 176 and the semiconductive structure 166. The insulative liner material may also be horizontally interposed between the fourth contact structure(s) 176 and one or more conductive structures formed in, on, or over the semiconductive structure 166. The insulative liner material may be formed over and include at least one insulative material, such as one or more of at least one dielectric oxide material, at least one dielectric nitride material, at least one dielectric oxynitride material, and at least one dielectric carboxynitride material. In some embodiments, the insulative liner material is formed of and includes at least one dielectric oxide material (e.g., $SiO_x$, such as $SiO_2$).

Still referring to FIG. 1D, at least one additional isolation material 188 may be formed to cover and surround the semiconductive structure 166, as well as portions of the second transistors 170, the third contact structures 172, the conductive routing structures 174, and the fourth contact structures 176. The additional isolation material 188 may be formed of and include at least one insulative material. By way of non-limiting example, the additional isolation material 188 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, and $TiO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the additional isolation material 188 is formed of and includes $SiO_x$ (e.g., $SiO_2$). The additional isolation material 188 may be substantially homogeneous, or the isolation material 150 may be heterogeneous. In some embodiments, the additional isolation material 188 is substantially homogeneous. In additional embodiments, the additional isolation material 188 is heterogeneous. The additional isolation material 188 may, for example, be formed of and include a stack of at least two different dielectric materials.

Figure 1E:
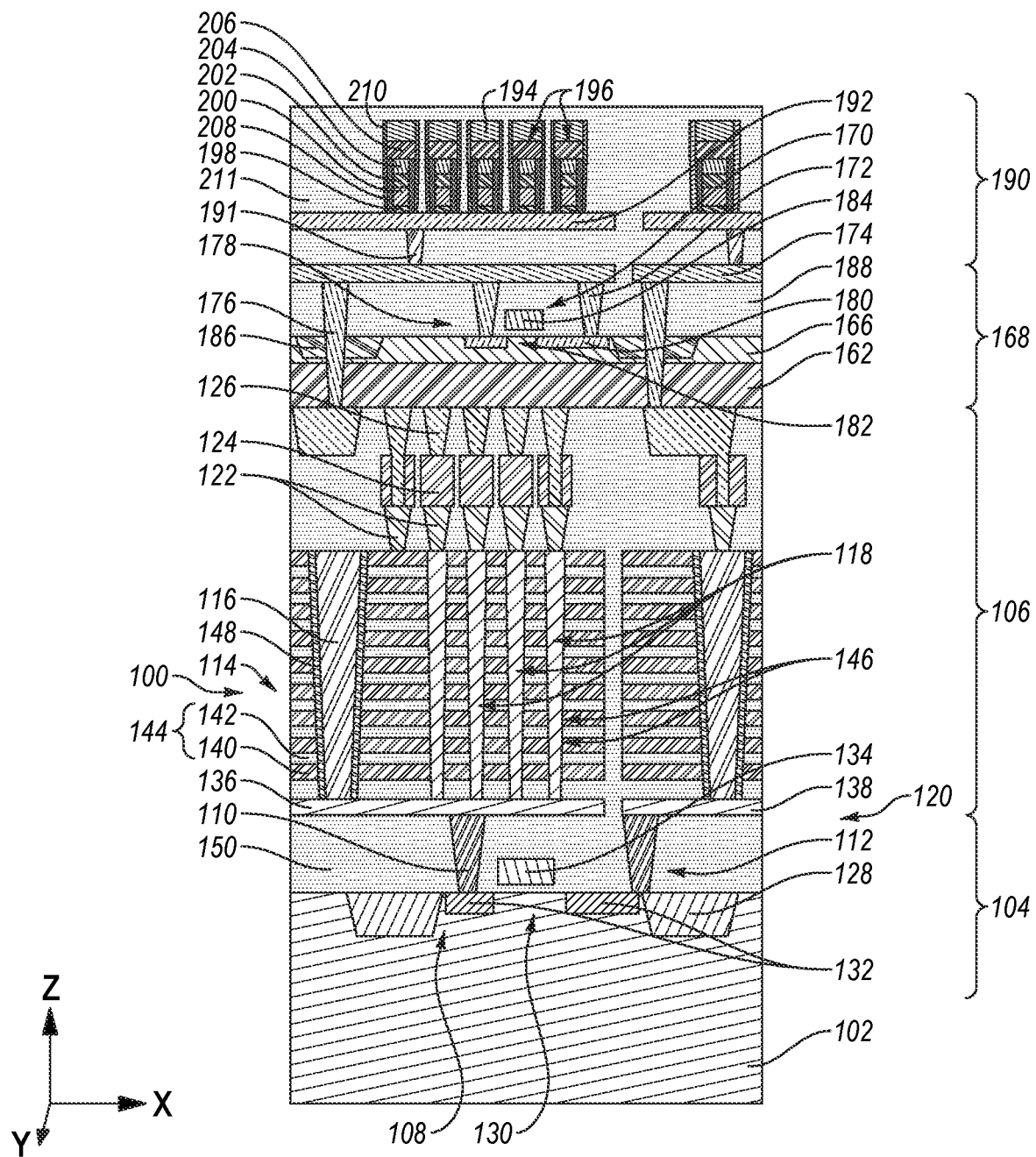

Referring next to FIG. 1E, a second memory array region 190 may be formed over the second control logic region 168. As shown in FIG. 1E, the second memory array region 190 may be formed to include first conductive line structures 192 horizontally extending in the X-direction, second conductive line structures 194 horizontally extending in the Y-direction, and resistance variable memory cells 196 vertically interposed in the Z-direction between the first conductive line structures 192 and the second conductive line structures 194. The resistance variable memory cells 196 may be horizontally positioned at intersections (e.g., cross points) of the first conductive line structures 192 and the second conductive line structures 194. As described in further detail below, the resistance variable memory cells 196 may individually include one resistance variable material. As used herein, the term "resistance variable material" means and includes a material formulated to be switched from one resistance state to another resistance state upon application of at least one physical signal (e.g., at least one of heat, voltage, current, or other physical phenomena) thereto. An array of the resistance variable memory cells 196 within the second memory array region 190 may exhibit a so-called "cross-point" architecture. Individual rows of the resistance variable memory cells 196 may extend in the X-direction along (e.g., substantially aligned with) and coupled to individual first conductive line structures 192. Individual columns of the resistance variable memory cells 196 may extend in the Y-direction along (e.g., substantially aligned with) and coupled to individual second conductive lines 194.

The first conductive line structures 192 may exhibit horizontally elongate shapes horizontally extending in parallel in the X-direction. In some embodiments, the first conductive line structures 192 each exhibit substantially the same dimensions (e.g., width in the Y-direction, length in the X-direction, height in the Z-direction), shape, and spacing (e.g., in the Y-direction). In additional embodiments, one or more of the first conductive line structures 192 exhibits one or more of at least one different dimension (e.g., a different length, a different width, a different height) and a different shape than one or more other of the first conductive line structures 192, and/or the spacing (e.g., in the Y-direction) between at least two horizontally neighboring first conductive line structures 192 is different than the spacing between at least two other horizontally neighboring first conductive line structures 192.

The first conductive line structures 192 may be formed of and include at least one conductive material, such as one or more of at least one metal, at least one metal alloy, at least one conductive metal oxide, at least one conductive metal nitride, at least one conductive metal silicide, and at least one conductively doped semiconductor material. The first conductive line structures 192 may, for example, be formed of and include one or more of W, WN, Ni, Ta, TaN, TaSi, Pt, Cu, Ag, Au, Al, Mo, Ti, TiN, TiSi, TiSiN, TiAlN, MoN, Ir, $IrO_x$, Ru, $RuO_x$, and conductively doped silicon. In some embodiments, the first conductive line structures 192 are formed of and include W. In additional embodiments, the first conductive line structures 192 are formed of and include Cu.

As shown in FIG. 1E, the first conductive line structures 192 may individually be coupled to one or more of the conductive routing structures 174 within the second control logic region 168 by way of fifth contact structures 191. Accordingly, the first conductive line structures 192 may individually be coupled to one or more of the second control logic devices 178 within the second control logic region 168 and/or to one or more of the first control logic devices 112 within the first control logic region 104. The fifth contact structures 191 may each individually be formed of and include conductive material. By way of non-limiting example, the fifth contact structures 191 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, the fifth contact structures 191 are formed of and include Cu. In additional embodiments, the fifth contact structures 191 are formed of and include W.

The second conductive line structures 194 may exhibit horizontally elongate shapes horizontally extending in parallel in the Y-direction. In some embodiments, the second conductive line structures 194 each exhibit substantially the same dimensions (e.g., width in the X-direction, length in the Y-direction, height in the Z-direction), shape, and spacing (e.g., in the X-direction). In additional embodiments, one or more of the second conductive line structures 194 exhibits one or more of at least one different dimension (e.g., a different length, a different width, a different height) and a different shape than one or more other of the second conductive line structures 194, and/or the spacing (e.g., in the Y-direction) between at least two horizontally neighboring second conductive line structures 194 is different than the spacing between at least two other horizontally neighboring second conductive line structures 194.

The second conductive line structures 194 may be formed of and include at least one conductive material, such as one or more of at least one metal, at least one metal alloy, at least one conductive metal oxide, at least one conductive metal nitride, at least one conductive metal silicide, and at least one conductively doped semiconductor material. The second conductive line structures 194 may, for example, be formed of and include one or more of W, WN, Ni, Ta, TaN, TaSi, Pt, Cu, Ag, Au, Al, Mo, Ti, TiN, TiSi, TiSiN, TiAlN, MoN, Ir, $IrO_x$, Ru, $RuO_x$, and conductively doped silicon. Material composition(s) of the second conductive line structures 194 may be substantially the same as or may be different than material composition(s) of the first conductive line structures 192. In some embodiments, the second conductive line structures 194 are formed of and include W. In additional embodiments, the second conductive line structures 194 are formed of and include Cu.

Still referring to FIG. 1E, the resistance variable memory cells 196 may be formed to comprise one or more of RRAM cells, conductive bridge RAM cells, MRAM cells, PCM memory cells, PCRAM cells, STTRAM cells, oxygen vacancy-based memory cells, and programmable conductor memory cells. In some embodiments, the resistance variable memory cells 196 are employed as cache memory for a memory device formed to include the first control logic region 104, the first memory array region 106, the second control logic region 168, and the second memory array region 190, as described in further detail below.

As shown in FIG. 1E, in some embodiments, individual resistance variable memory cells 196 within the second memory array region 190 are formed to include a stack of materials including a first electrode material 198 on or over one of the first conductive line structures 192, a storage element material 200 on or over the first electrode material 198, a second electrode material 202 on or over the storage element material 200, a select device material 204 on or over the second electrode material 202, and third electrode material 206 vertically interposed between (e.g., vertically extending from and between) the select device material 204 and one of the second conductive line structures 194. Such a configuration for one or more (e.g., each) of the resistance variable memory cells 196 is described in further detail below. In additional embodiments, one or more (e.g., each) of the resistance variable memory cells 196 is formed to exhibit a different configuration, as is also described in further detail below. In addition, in some embodiments, a protective liner material 208 is formed to at least partially cover and surround the stack of materials (e.g., at least the storage element material 200 and the select device material 204, such as each of the first electrode material 198, the storage element material 200, the second electrode material 202, the select device material 204, and the third electrode material 206); and a seal material 210 is formed to at least partially cover and surround the protective liner material 208 (and, optionally, one or more of the third electrode material 206 and the second conductive line structures 194).

The storage element material 200 of the resistance variable memory cells 196, which may also be characterized as programmable material, may be formed of and include at least one resistance variable material. Embodiments of the disclosure are not limited to a particular resistance variable material. The storage element material 200 may, for example, be formed of and include a resistance variable material configured and formulated for one or more of RRAM, conductive bridging RAM, MRAM, PCM memory, PCRAM, STTRAM, oxygen vacancy-based memory, and programmable conductor memory. Suitable resistance variable materials include, but are not limited to, active switching materials (e.g., solid state electrolyte materials, such as transition metal oxide (TMO) materials, chalcogenide materials, dielectric metal oxide materials, mixed valence oxides including two or more metals and/or metalloids), metal ion source materials, oxygen-gettering materials, phase change materials, binary metal oxide materials, colossal magnetoresistive materials, and polymer-based resistance variable materials.

The select device material 204 (e.g., access device material) of the resistance variable memory cells 196 may be formed of and include at least one material configured and formulated to form a switch for the storage element material 200 of the resistance variable memory cells 196. The select device material 204 may, for example, comprise at least one material facilitating the formation of a non-ohmic device (NOD) stack, such as one or more of at least one chalcogenide material, at least one semiconductor material, and at least one insulative material. The NOD stack may, for example, exhibit an ovonic threshold switch (OTS) configuration, a conductor-semiconductor-conductor (CSC) switch configuration, a metal-insulator-metal (MIM) switch configuration, a metal-semiconductor-metal (MSM) switch configuration, a metal-insulator-insulator-metal (MIIM) switch configuration, a metal-semiconductor-semiconductor-metal (MSSM) switch configuration, a metal-insulator-semiconductor-metal (MISM) switch configuration, a metal-semiconductor-insulator-metal (MSIM) switch configuration, a metal-insulator-semiconductor-insulator-metal (MISIM) switch configuration, a metal-semiconductor-insulator-semiconductor-metal (MSISM) switch configuration, a metal-insulator-insulator-insulator-metal (MIIIM) switch configuration, a metal-semiconductor-semiconductor-semiconductor-metal (MSSSM) switch configuration, mixed ionic electronic conduction (MIEC) switch configuration, or another type of two-terminal select device configuration.

In some embodiments, one or more of the storage element material 200 and the select device material 204 of the resistance variable memory cells 196 is formed of and includes at least one chalcogenide material. If both the storage element material 200 and the select device material 204 comprise chalcogenide materials, the storage element material 200 may, for example, comprise a chalcogenide material that is capable of undergoing a non-volatile phase change. In some such embodiments, the select device material 204 comprises an additional chalcogenide material that does not undergo a similar non-volatile phase change.

In some embodiments, the storage element material 200 is formed of and includes a phase change material having a chalcogenide composition including at least two of elements within the indium(In)-antimony(Sb)-tellurium(Te) (IST) alloy system (e.g., $In_2Sb_2Te_5$, $In_1Sb_2Te_4$, $In_1Sb_4Te_7$), or an at least two of elements within the germanium(Ge)-antimony(Sb)-tellurium(Te) (GST) alloy system (e.g., $Ge_8Sb_5Te_8$, $Ge_2Sb_2Te_5$, $Ge_1Sb_2Te_4$, $Ge_1Sb_4Te_7$, $Ge_4Sb_4Te_7$). Hyphenated chemical composition notations, as used herein, indicate the elements included in a particular material, and are intended to represent all stoichiometries involving the indicated elements. In additional embodiments, the storage element material 200 is formed of and includes a phase change material having a different chalcogenide composition, such as one or more of Ge—Te, In—Se, Sb—Te, Ga—Sb, In—Sb, As—Te, Al—Te, In—Ge-Te, Ge—Sb-Te, Te—Ge-As, In—Sb-Te, Te—Sn—Se, Ge—Se-Ga, Bi—Se—Sb, Ga—Se-Te, Sn—Sb-Te, In—Sb-Ge, Te—Ge—Sb—S, Te—Ge—Sn—O, Te—Ge—Sn—Au, Pd—Te-Ge—Sn, In—Se-Ti—Co, Ge—Sb-Te—Pd, Ge—Sb-Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt.

In some embodiments, the select device material 204 has a chalcogenide composition. The chalcogenide composition of the select device material 204 may, for example, comprise any one of the chalcogenide compositions previously described above for the storage element material 200. Optionally, the select device material 204 may further include an element that suppresses crystallization, such as arsenic (As). Non-limiting examples, material compositions for the select device material 204 include Te—As-Ge—Si, Ge—Te—Pb, Ge—Se-Te, Al—As-Te, Se—As-Ge—Si, Se—As-Ge—C, Se—Te-Ge—Si, Ge—Sb-Te—Se, Ge—Bi-Te—Se, Ge—As—Sb—Se, Ge—As—Bi—Te, and Ge—As—Bi—Se.

The first electrode material 198, the second electrode material 202, and the third electrode material 206 of the resistance variable memory cells 196 may each individually comprise at least one conductive material that electrically connects other features (e.g., materials, structures) of the second memory array region 190 adjacent thereto and that substantially prevents undesirable reactions between materials. For example, if the storage element material 200 and the select device material 204 of the resistance variable memory cells 196 comprise chalcogenide materials, the first electrode material 198, the second electrode material 202, and the third electrode material 206 may each individual comprise non-reactive conductive materials that substantially prevent interdiffusion of materials adjacent (e.g., vertically adjacent) thereto. Examples of suitable conductive materials for the first electrode material 198, the second electrode material 202, and the third electrode material 206 include, but are not limited to, carbon (C); conductively doped silicon; metals (e.g., Al, Cu, Ni, Cr, Co, Ru, Rh, Pd, Ag, Pt, Au, Ta, W); conductive metal nitrides (e.g., $TiN_x$, $TaN_x$, $WN_x$, and $TaC_xN_y$); conductive metal silicides ($TaSi_x$, $WSi_x$, $NiSi_x$, $CoSi_x$, and $TiSi_x$); and conductive metal oxides (e.g., $RuO_2$). In additional embodiments, the first electrode material 198 is omitted (e.g., absent) from the resistance variable memory cells 196. In such embodiments, the first conductive line structures 192 serve as lower electrodes for the resistance variable memory cells 196. In further embodiments, the third electrode material 206 is omitted (e.g., absent) from the resistance variable memory cells 196. In such embodiments, the second conductive line structures 194 serve as upper electrodes for the resistance variable memory cells 196.

Still referring to FIG. 1E, if formed, the protective liner material 208 may be formed of and include at least one material configured to protect portions of the resistance variable memory cells 196 covered thereby (e.g., the storage element material 200, the select device material 204, the first electrode material 198, the second electrode material 202) from cross contamination and configured to control associated variations in horizontal widths of materials above and below an interface between the storage element material 200 and the second electrode material 202. In some embodiments, the protective liner material 208 is formed of and includes a fluorocarbon material. As used herein, a "fluorocarbon material" means and includes a material including carbon atoms and fluorine atoms. In additional embodiments, the protective liner material 208 is omitted (e.g., absent) from the second memory array region 190. For example, surfaces of the resistance variable memory cells 196 may be free of the protective liner material 208 thereon or thereover.

If formed, the seal material 210 may be formed of and include at least one material configured to protect portions of the resistance variable memory cells 196 covered thereby during subsequent processing acts (e.g., etching acts, cleaning acts, gapfill acts, thermal treatment acts) to maintain desired geometric configurations and properties of the resistance variable memory cells 196. In some embodiments, the seal material 210 is formed of and includes at least one dielectric material, such as one or more of a dielectric oxide material (e.g., $SiO_x$, such as $SiO_2$; $AlO_x$, such as $Al_2O_3$) and a dielectric nitride material (e.g., $SiN_y$, such as $Si_3N_4$). In some embodiments, the seal material 210 is formed on side surfaces (e.g., outer sidewalls) of the protective liner material 208, the third electrode material 206, and the second conductive line structures 194. In additional embodiments, such as embodiments wherein the protective liner material 208 is absent, the seal material 210 is formed on side surfaces (e.g., outer sidewalls) of the first electrode material 198, the storage element material 200, the second electrode material 202, the select device material 204, the third electrode material 206, and the second conductive line structures 194.

Still referring to FIG. 1E, at least one further isolation material 211 may be formed to cover and surround the resistance variable memory cells 196, as well as portions of the first conductive line structures 192 and the second conductive line structures 194. The further isolation material 211 may be formed of and include at least one insulative material. By way of non-limiting example, the further isolation material 211 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, and $TiO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the further isolation material 211 is formed of and includes $SiO_x$ (e.g., $SiO_2$). The further isolation material 211 may be substantially homogeneous, or the further isolation material 211 may be heterogeneous. In some embodiments, the further isolation material 211 is substantially homogeneous. In additional embodiments, the further isolation material 211 is heterogeneous. The further isolation material 211 may, for example, be formed of and include a stack of at least two different dielectric materials.

In additional embodiments, the second memory array region 190 is formed to exhibit a different configuration than that described above with reference to FIG. 1E. As a non-limiting example, for each of the resistance variable memory cells 196, the positions of the storage element material 200 and the select device material 204 may be switched (e.g., interchanged with one another) relative to the positions shown in and described with reference to FIG. 1E, such that the storage element material 200 vertically overlies the select device material 204. As another non-limiting example, for each of the resistance variable memory cells 196, the select device material 204 may be omitted from the resistance variable memory cells 196. As a further non-limiting example, for each of the resistance variable memory cells 196, one or more of the first electrode material 198, the second electrode material 202, and the third electrode material 206 may be omitted. As an additional non-limiting example, the orientations of the first conductive line structures 192 and the second conductive line structures 194 switched (e.g., interchanged with one another) relative to the orientations shown in and described with reference to FIG. 1E, such that the first conductive line structures 192 horizontally extend in parallel in the Y-direction and the second conductive line structures 194 horizontally extend in parallel in the X-direction.

Figure 1F:
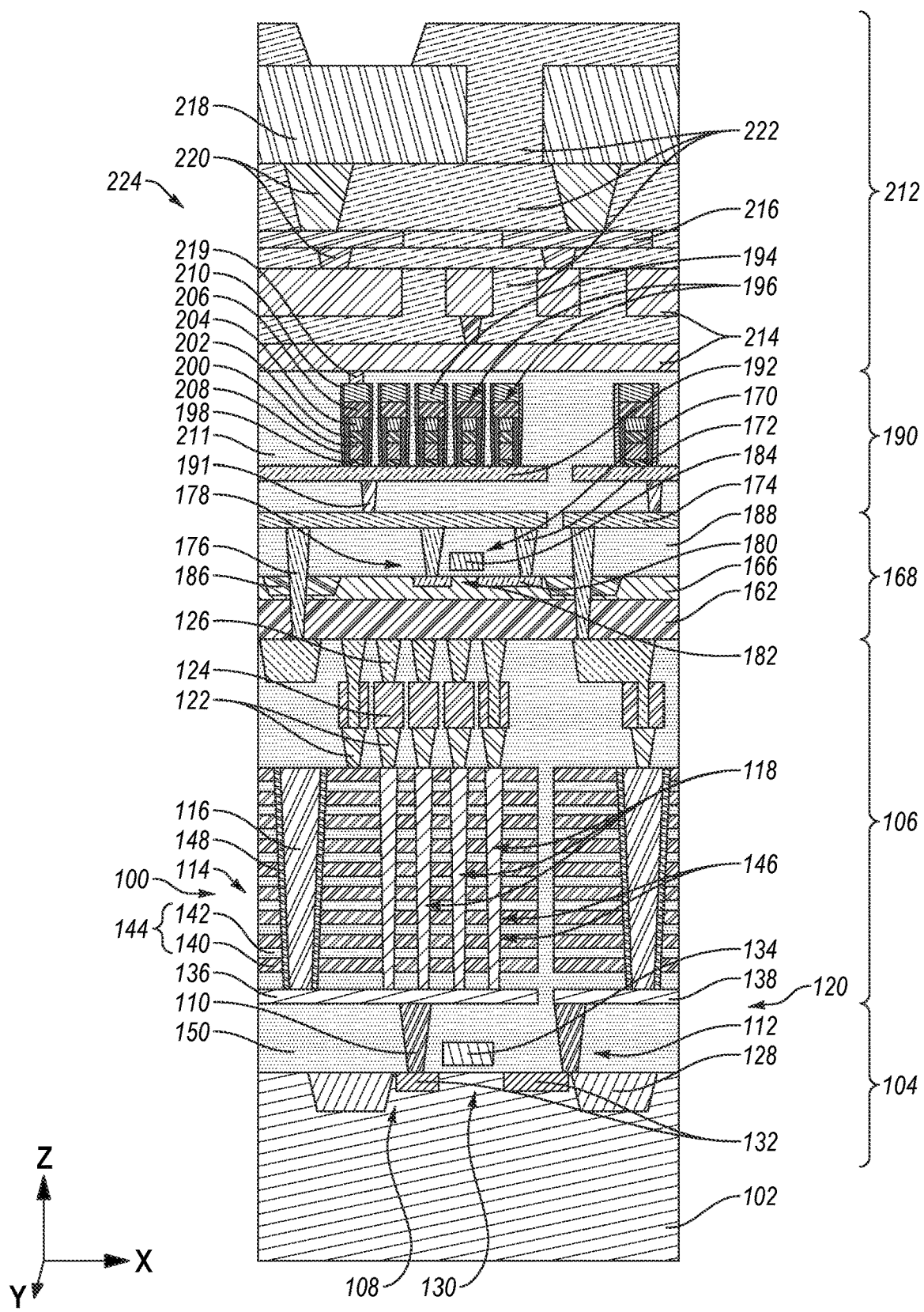

Referring next to FIG. 1F, an interconnect region 212 may be formed over the second memory array region 190. The interconnect region 212 may be formed to include first routing structures 214 vertically overlying the second memory array region 190, second routing structures 216 vertically overlying the first routing structures 214, and conductive pad structures 218 vertically overlying the second routing structures 216. The first routing structures 214 may be coupled to one or more components (e.g., one or more of the second conductive line structures 194) of the second memory array region 190 by way of sixth contact structures 219. In addition, the second routing structures 216 may be coupled to the first routing structures 214 and the conductive pad structures 218 by way of seventh contact structures 220. As shown in FIG. 1F, some of the seventh contact structures 220 may vertically extend from and between the second routing structures 216 and the first routing structures 214, and other of the seventh contact structures 220 may vertically extend from and between the second routing structures 216 and the conductive pad structures 218. In addition, still other of the seventh contact structures 220 may vertically extend from and between the vertically neighboring second routing structures 216.

The first routing structures 214, the second routing structures 216, the sixth contact structures 219, the seventh contact structures 220, and the conductive pad structures 218 may each be formed of and include conductive material. By way of non-limiting example, first routing structures 214, the second routing structures 216, the sixth contact structures 219, the seventh contact structures 220, and the conductive pad structures 218 may each individually be formed of and include one or more of at least one metal, at least one alloy, and at least one conductive metal-containing material (e.g., a conductive metal nitride, a conductive metal silicide, a conductive metal carbide, a conductive metal oxide). In some embodiments, the first routing structures 214 and the second routing structures 216 are each formed of and include Cu; the conductive pads structures 218 are formed of and include Al; and the sixth contact structures 219 and the seventh contact structures 220 are each formed of and include W.

Still referring to FIG. 1F, at least one other isolation material 222 may be formed to cover and surround the first routing structures 214, the second routing structures 216, the sixth contact structures 219, the seventh contact structures 220, and the conductive pad structures 218. The other isolation material 222 may be formed of and include at least one insulative material. By way of non-limiting example, the other isolation material 222 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, and $TiO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the other isolation material 222 is formed of and includes $SiO_x$ (e.g., $SiO_2$). The other isolation material 222 may be substantially homogeneous, or the other isolation material 222 may be heterogeneous. In some embodiments, the other isolation material 222 is substantially homogeneous. In additional embodiments, the other isolation material 222 is heterogeneous. The other isolation material 222 may, for example, be formed of and include a stack of at least two different dielectric materials.

As shown in FIG. 1F, the formation of the interconnect region 212 may effectuate the formation of a microelectronic device 224 (e.g., a memory device). The microelectronic device 224 may include the first control logic region 104, the first memory array region 106 vertically overlying the first control logic region 104, the second control logic region 168 vertically overlying the first memory array region 106, the second memory array region 190 vertically overlying the second control logic region 168, and the interconnect region 212 vertically overlying the second memory array region 190. In some embodiments, at least some of the first routing structures 214 of the interconnect region 212 are employed as local routing structures for the microelectronic device 224, and at least some of the second routing structures 216 and the conductive pad structures 218 are employed as global routing structures for the microelectronic device 224. The second routing structures 216 and the conductive pad structures 218 may, for example, be configured to receive global signals from an external bus, and to relay the global signals to other components (e.g., structures, devices) of the microelectronic device 224.

The configuration of the microelectronic device 224 may facilitate enhanced device performance (e.g., speed, data transfer rates, power consumption) relative to conventional microelectronic device configuration. The microelectronic device 224 combines the advantages of resistance variable memory configurations and 3D NAND Flash memory configurations within a single structure (e.g., a single die), facilitating, for example, the use of the resistance variable memory for relatively high speed, cache memory operations of the microelectronic device 224, and the use of the 3D NAND Flash memory for additional memory operations of the microelectronic device. In addition, the method described above with reference to FIGS. 1A through 1F resolves limitations on array (e.g., memory cell array) configurations, control logic device configurations, and associated device performance that may otherwise result from thermal budget constraints imposed by the formation and/or processing of arrays (e.g., memory cell arrays) of a microelectronic device. For example, by forming the second control logic region 168 and the second memory array region 190 subsequent to the formation of the microelectronic device structure 100 including the first control logic region 104 and the first memory array region 106, configurations of the first control logic devices 112 of the first control logic region 104 and the strings of memory cells 146 of the first memory array region 106 are not limited by the processing conditions (e.g., temperatures, pressures, materials) required to form the second control logic devices 178 of the second control logic region 168 and the resistance variable memory cells 196 of the second memory array region 190.

Thus, in accordance with embodiments of the disclosure, a method of forming a microelectronic device comprises forming a microelectronic device structure comprising a first control logic region comprising first control logic devices, and a first memory array region vertically overlying the first control logic region and comprising an array of vertically extending strings of memory cells. An additional microelectronic device structure comprising a semiconductive material is attached to an upper surface of the microelectronic device structure. A portion of the semiconductive material is removed. A second control logic region is formed over the first memory array region. The second control logic region comprises second control logic devices and a remaining portion of the semiconductive material. A second memory array region is formed over the second control logic region. The second memory array region comprises an array of resistance variable memory cells.

Furthermore, in accordance with embodiments of the disclosure, a microelectronic device comprises a first control logic region, a first memory array region overlying the first control logic region, a second control logic region overlying the first memory array region, and a second memory array region overlying the second control logic region. The first control logic region comprises first control logic devices. The first memory array region comprises a stack structure comprising a vertically alternating sequence of conductive structures and insulative structures, and vertically extending strings of memory cells within the stack structure and in electrical communication with the first control logic devices of the first control logic region. The second control logic region comprises second control logic devices in electrical communication with the first control logic devices and the vertically extending strings of memory cells. The second memory array region comprises resistance variable memory cells in electrical communication with the first control logic devices and the second control logic devices.

Furthermore, in accordance with embodiments of the disclosure, a memory device comprises a stack structure, vertically extending strings of memory cells within the stack structure, resistance variable memory cells overlying the stack structure, control logic devices comprising complementary metal-oxide-semiconductor (CMOS) circuitry underlying the stack structure, and additional control logic devices comprising additional CMOS circuitry vertically interposed between the stack structure and the resistance variable memory cells. The stack structure comprises tiers each comprising a conductive structure and an insulative structure vertically neighboring the conductive structure. The control logic devices are configured to effectuate a portion of control operations for the vertically extending strings of memory cells and the resistance variable memory cells. The additional control logic devices have relatively lower operational voltage requirements than the control logic devices, and are configured to effectuate an additional portion of the control operations for the vertically extending strings of memory cells and the resistance variable memory cells.

Figure 2:
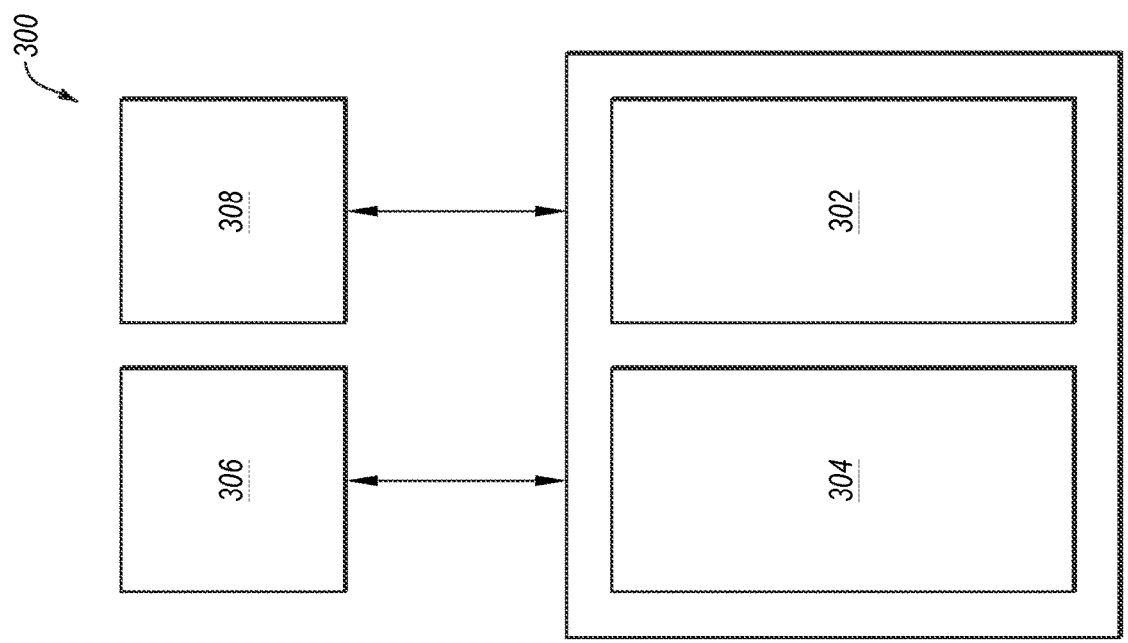
FIG. 2 is a schematic block diagram of an electronic system, in accordance with an embodiment of the disclosure.

Microelectronic devices (e.g., the microelectronic device 224 (FIG. 1F)) in accordance with embodiments of the disclosure may be used in embodiments of electronic systems of the disclosure. For example, FIG. 2 is a block diagram of an illustrative electronic system 300 according to embodiments of disclosure. The electronic system 300 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 300 includes at least one memory device 302. The memory device 302 may comprise, for example, a microelectronic device (e.g., the microelectronic device 224 (FIG. 1F)) previously described herein. The electronic system 300 may further include at least one electronic signal processor device 304 (often referred to as a "microprocessor"). The electronic signal processor device 304 may, optionally, comprise a microelectronic device (e.g., the microelectronic device 224 (FIG. 1F)) previously described herein. While the memory device 302 and the electronic signal processor device 304 are depicted as two (2) separate devices in FIG. 2, in additional embodiments, a single (e.g., only one) memory/processor device having the functionalities of the memory device 302 and the electronic signal processor device 304 is included in the electronic system 300. In such embodiments, the memory/processor device may include a microelectronic device (e.g., the microelectronic device 224 (FIG. 1F)) previously described herein. The electronic system 300 may further include one or more input devices 306 for inputting information into the electronic system 300 by a user, such as, for example, a mouse or other pointing device, a keyboard, a touchpad, a button, or a control panel. The electronic system 300 may further include one or more output devices 308 for outputting information (e.g., visual or audio output) to a user such as, for example, a monitor, a display, a printer, an audio output jack, a speaker, etc. In some embodiments, the input device 306 and the output device 308 comprise a single touchscreen device that can be used both to input information to the electronic system 300 and to output visual information to a user. The input device 306 and the output device 308 may communicate electrically with one or more of the memory device 302 and the electronic signal processor device 304.

Thus, in accordance with embodiments of the disclosure, an electronic system comprises an input device, an output device, a processor device operably connected to the input device and the output device, and a memory device operably connected to the processor device. The memory device comprises a stack structure, a source structure, digit line structures, strings of memory cells, resistance variable memory cells, control logic devices, additional control logic devices, and conductive routing structures. The stack structure comprises conductive structures vertically alternating with insulative structures. The source structure underlies the stack structure. The digit line structures overlie the stack structure. The strings of memory cells vertically extend through the stack structure and are coupled to the source structure and the digit line structures. The control logic devices vertically underlie the source structure and are coupled to the strings of memory cells and the resistance variable memory cells. The additional control logic devices are vertically between the digit line structures and the resistance variable memory cells and are coupled to the strings of memory cells and the resistance variable memory cells. The conductive routing structures overlie the resistance variable memory cells and are coupled to the control logic devices and the additional control logic devices.

The structures, devices, and methods of the disclosure advantageously facilitate one or more of improved microelectronic device performance, reduced costs (e.g., manufacturing costs, material costs), increased miniaturization of components, and greater packaging density as compared to conventional structures, conventional devices, and conventional methods. The structures, devices, and methods of the disclosure may also improve scalability, efficiency, and simplicity as compared to conventional structures, conventional devices, and conventional methods.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalent. For example, elements and features disclosed in relation to one embodiment may be combined with elements and features disclosed in relation to other embodiments of the disclosure.

What is claimed is:

1. A method of forming a microelectronic device, comprising:
    forming a microelectronic device structure comprising:
        a first control logic region comprising first control logic devices; and
        a first memory array region vertically overlying the first control logic region and comprising an array of vertically extending strings of memory cells;
    attaching an additional microelectronic device structure comprising a semiconductive material to an upper surface of the microelectronic device structure;
    removing a portion of the semiconductive material;
    forming a second control logic region over the first memory array region, the second control logic region comprising second control logic devices and a remaining portion of the semiconductive material; and forming a second memory array region over the second control logic region, the second memory array region comprising an array of resistance variable memory cells.

2. The method of claim 1, wherein forming a microelectronic device structure comprises forming the first memory array region of the microelectronic device structure to further comprise:
at least one source structure;
a stack structure over the at least one source structure and comprising a vertically alternating sequence of conductive structures and insulative structures, the array of vertically extending strings of memory cells located within the stack structure and coupled to the at least one source structure; and
digit line structures over the stack structure and coupled to the array of vertically extending strings of memory cells.

3. The method of claim 2, wherein forming a second memory array region over the second control logic region comprises forming the second memory array region to further comprise:
first conductive line structures over the second control logic region and under the array of resistance variable memory cells, the first conductive line structures extending in parallel in a first horizontal direction; and
second conductive line structures over the array of resistance variable memory cells and extending in parallel in a second horizontal direction orthogonal to the first horizontal direction, each resistance variable memory cell of the array of resistance variable memory cells horizontally positioned at an intersection of one of the first conductive line structures and one of the second conductive line structures.

4. The method of claim 1, wherein:
attaching an additional microelectronic device structure comprises bonding a dielectric material of the additional microelectronic device structure adjacent to the semiconductive material to an additional dielectric material of the microelectronic device structure; and
removing a portion of the semiconductive material comprises detaching an upper portion of the semiconductive material to leave the dielectric material and the remaining portion of the semiconductive material.

5. The method of claim 1, wherein forming a second control logic region over the first memory array region comprises forming transistors of the second control logic devices partially within and from the remaining portion of the semiconductive material.

6. The method of claim 1, wherein forming a second control logic region over the first memory array region comprises forming the second control logic devices of the second control logic region to have different configurations and operational functions than the first control logic devices of the first control logic region.

7. The method of claim 6, wherein forming the second control logic devices of the second control logic region to have different configurations and operational functions than the first control logic devices of the first control logic region comprises forming the second control logic devices to operate at applied voltages within a range of from about 0.7V to about 1.4 V.

8. The method of claim 7, further comprising forming the first control logic devices of the first control logic region to comprise additional CMOS circuitry configured to operate at other applied voltages greater than the applied voltages effective to operate of the second control logic devices of the second control logic region.

9. The method of claim 1, wherein forming a second memory array region over the second control logic region comprises forming the array of resistance variable memory cells of the second memory array region to be in electrical communication with the second control logic devices of the second control logic region and the first control logic devices of the first control logic region.

10. The method of claim 1, further comprising forming an interconnect region over the second memory array region, the interconnect region comprising:
conductive routing structures overlying the second memory array region; and
conductive pad structures overlying and in electrical communication with the conductive routing structures.

11. A microelectronic device, comprising:
a first control logic region comprising first control logic devices;
a first memory array region overlying the first control logic region and comprising:
stack structure comprising a vertically alternating sequence of conductive structures and insulative structures; and
vertically extending strings of memory cells within the stack structure and in electrical communication with the first control logic devices of the first control logic region;
a second control logic region overlying the first memory array region and comprising second control logic devices in electrical communication with the first control logic devices and the vertically extending strings of memory cells; and
a second memory array region overlying the second control logic region and comprising resistance variable memory cells in electrical communication with the first control logic devices and the second control logic devices.

12. The microelectronic device of claim 11, wherein the first memory array region further comprises:
at least one source structure vertically interposed between and in electrical communication with the vertically extending strings of memory cells and the first control logic devices; and
digit line structures vertically overlying and between and in electrical communication with the vertically extending strings of memory cells.

13. The microelectronic device of claim 11, wherein the second control logic devices of the second control logic region are configured to effectuate different operational functions for the vertically extending strings of memory cells of the first memory array region and the resistance variable memory cells of the second memory array region than the first control logic devices of the first control logic region.

14. The microelectronic device of claim 13, wherein:
the second control logic devices of the second control logic region are configured to operate at applied voltages within a range of from about 0.7V to about 1.4V; and
the first control logic devices of the first control logic region are configured to operate at additional applied voltages greater than the applied voltages.

15. The microelectronic device of claim 11, wherein each memory cell of the vertically extending strings of memory cells of the first memory array region comprises a metal-oxide-nitride-oxide-semiconductor (MONOS) memory cell.

16. The microelectronic device of claim 11, wherein each resistance variable memory cell of the second memory array region comprises a storage element comprising a solid state electrolyte material.

17. The microelectronic device of claim 16, wherein the solid state electrolyte material comprises a chalcogenide material.

18. The microelectronic device of claim 11, wherein the second memory array region comprises:
   rows of the resistance variable memory cells vertically over and in physical contact with first conductive line structures extending in a first horizontal direction; and
   columns of the resistance variable memory cells vertically under and in physical contact with second conductive line structures extending in a second horizontal direction perpendicular to the first horizontal direction.

19. The microelectronic device of claim 11, further comprising:
   conductive routing structures vertically overlying the second memory array region and in electrical communication with one or more of the first control logic devices of the first control logic region and the second control logic devices of the second control logic region; and
   conductive pad structures vertically overlying and in electrical communication with the conductive routing structures.

20. A memory device, comprising:
   a stack structure comprising tiers each comprising a conductive structure and an insulative structure vertically neighboring the conductive structure;
   vertically extending strings of memory cells within the stack structure;
   resistance variable memory cells overlying the stack structure;
   control logic devices comprising complementary metal-oxide-semiconductor (CMOS) circuitry underlying the stack structure, the control logic devices configured to effectuate a portion of control operations for the vertically extending strings of memory cells and the resistance variable memory cells; and
   additional control logic devices comprising additional CMOS circuitry vertically interposed between the stack structure and the resistance variable memory cells, the additional control logic devices having relatively lower operational voltage requirements than the control logic devices and configured to effectuate an additional portion of the control operations for the vertically extending strings of memory cells and the resistance variable memory cells.

21. The memory device of claim 20, further comprising:
   at least one source structure vertically interposed between the stack structure and the control logic devices, the at least one source structure in electrical communication with the vertically extending strings of memory cells; and
   digit line structures vertically interposed between the stack structure and the additional control logic devices, the digit line structures in electrical communication with the vertically extending strings of memory cells.

22. The memory device of claim 21, further comprising:
   first conductive line structures vertically interposed between the additional control logic devices and the resistance variable memory cells and extending in a first horizontal direction, the first conductive line structures in electrical communication with the resistance variable memory cells; and
   second conductive line structures vertically overlying and in in electrical communication with the resistance variable memory cells, the second conductive line structures extending in a second horizontal direction orthogonal to the first horizontal direction.

23. The memory device of claim 22, wherein the at least one source structure, the digit line structures, the first conductive line structures, and the second conductive line structures are in electrical communication with the control logic devices and the additional control logic devices.

24. The memory device of claim 20, further comprising:
   conductive routing structures vertically overlying the resistance variable memory cells and in electrical communication with the control logic devices and the additional control logic devices; and
   conductive pad structures vertically overlying and in electrical communication with the conductive routing structures.

25. An electronic system, comprising:
   an input device;
   an output device;
   a processor device operably connected to the input device and the output device; and
   a memory device operably connected to the processor device and comprising:
      a stack structure comprising conductive structures vertically alternating with insulative structures;
      a source structure underlying the stack structure;
      digit line structures overlying the stack structure;
      strings of memory cells vertically extending through the stack structure and coupled to the source structure and the digit line structures;
      resistance variable memory cells overlying the digit line structures;
      control logic devices vertically underlying the source structure and coupled to the strings of memory cells and the resistance variable memory cells;
      additional control logic devices vertically between the digit line structures and the resistance variable memory cells and coupled to the strings of memory cells and the resistance variable memory cells; and
      conductive routing structures overlying the resistance variable memory cells and coupled to the control logic devices and the additional control logic devices.

* * * * *

UNITED STATES PATENT AND TRADEMARK OFFICE
CERTIFICATE OF CORRECTION

| | | |
|---|---|---|
| PATENT NO. | : 11,751,408 B2 | Page 1 of 1 |
| APPLICATION NO. | : 17/165746 | |
| DATED | : September 5, 2023 | |
| INVENTOR(S) | : Kunal R. Parekh | |

It is certified that error appears in the above-identified patent and that said Letters Patent is hereby corrected as shown below:

In the Specification

| | | |
|---|---|---|
| Column 5, | Line 5, | change "oxide ($NbO_x$—)," to --oxide ($NbO_x$),-- |
| Column 5, | Line 15, | change "of "x" "y," and" to --of "x," "y," and-- |
| Column 5, | Lines 24-25, | change "of "x", "y", "x," "y," and" to --of "x," "y," and-- |
| Column 12, | Lines 5-6, | change "(metal-oxide-nitride-oxide-semiconductor)" to --(metal - oxide - nitride - oxide - semiconductor)-- |
| Column 12, | Line 8, | change "nitride-aluminum oxide-nitride-oxide-semiconductor)" to --nitride - aluminum oxide - nitride - oxide - semiconductor)-- |
| Column 15, | Line 47, | change "material, as" to --material, such as-- |
| Column 15, | Line 67, | change "include one one or" to --include one or-- |
| Column 17, | Line 25, | change "(FIG. 1B)" to --(FIG. 1B).-- |
| Column 24, | Lines 40-42, | change "In—Ge-Te, Ge—Sb-Te, Te—Ge-As, In—Sb-Te, Te—Sn—Se, Ge—Se-Ga, Bi—Se—Sb, Ga—Se-Te, Sn—Sb-Te, In—Sb-Ge," to --In—Ge—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge,-- |
| Column 24, | Lines 43-45, | change "Pd—Te-Ge—Sn, In—Se-Ti—Co, Ge—Sb-Te—Pd, Ge—Sb-Te—Co," to --Pd—Te—Ge—Sn, In—Se—Ti—Co, Ge—Sb—Te—Pd, Ge—Sb—Te—Co,-- |
| Column 24, | Lines 56-59, | change "Te—As-Ge—Si, Ge—Te—Pb, Ge—Se-Te, Al—As-Te, Se—As-Ge—Si, Se—As-Ge—C, Se—Te-Ge—Si, Ge—Sb-Te—Se, Ge—Bi-Te—Se," to --Te—As—Ge—Si, Ge—Te—Pb, Ge—Se—Te, Al—As—Te, Se—As—Ge—Si, Se—As—Ge—C, Se—Te—Ge—Si, Ge—Sb—Te—Se, Ge—Bi—Te—Se,-- |

Signed and Sealed this
Thirty-first Day of October, 2023

*Katherine Kelly Vidal*

Katherine Kelly Vidal
*Director of the United States Patent and Trademark Office*